(12) United States Patent
Kim

(10) Patent No.: US 9,401,394 B2
(45) Date of Patent: Jul. 26, 2016

(54) METHOD OF MANUFACTURING DISPLAY APPARATUS

(71) Applicant: SAMSUNG DISPLAY CO., LTD., Yongin-si, Gyeonggi-do (KR)

(72) Inventor: Tae-Gon Kim, Yongin-si (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 0 days.

(21) Appl. No.: 14/925,672

(22) Filed: Oct. 28, 2015

(65) Prior Publication Data

US 2016/0049457 A1 Feb. 18, 2016

Related U.S. Application Data

(62) Division of application No. 13/963,273, filed on Aug. 9, 2013, now Pat. No. 9,184,223.

(30) Foreign Application Priority Data

Mar. 25, 2013 (KR) ........................ 10-2013-0031253

(51) Int. Cl.
*H01L 21/00* (2006.01)
*H01L 27/32* (2006.01)
*H01L 27/12* (2006.01)

(52) U.S. Cl.
CPC .......... *H01L 27/3276* (2013.01); *H01L 27/124* (2013.01); *H01L 27/1262* (2013.01)

(58) Field of Classification Search
USPC .......... 438/23, 99; 257/40; 349/139; 313/498
See application file for complete search history.

(56) References Cited

U.S. PATENT DOCUMENTS

| 6,737,653 | B2 | 5/2004 | Choo et al. |
| 6,906,331 | B2 | 6/2005 | Choo et al. |
| 6,909,099 | B2 | 6/2005 | Choo et al. |
| 7,772,764 | B2 | 8/2010 | Goh et al. |
| 2002/0145116 | A1 | 10/2002 | Choo et al. |
| 2004/0183023 | A1 | 9/2004 | Choo et al. |
| 2004/0183024 | A1 | 9/2004 | Choo et al. |
| 2004/0224241 | A1 | 11/2004 | Park et al. |
| 2004/0252267 | A1 | 12/2004 | Ma et al. |
| 2007/0120457 | A1 | 5/2007 | Goh et al. |

FOREIGN PATENT DOCUMENTS

| JP | 06-0011721 A | 1/1994 |
| JP | 2005-005039 A | 1/2005 |
| KR | 10-1999-0049196 A | 7/1999 |
| KR | 10-2004-0070396 A | 8/2004 |
| KR | 10-2005-0094074 A | 9/2005 |

*Primary Examiner* — Telly Green
(74) *Attorney, Agent, or Firm* — Lee & Morse, P.C.

(57) ABSTRACT

A display apparatus includes a plurality of pixels, a signal transmission line, a pad and a buffer. The pixels display an image. The signal transmission line is electrically connected to at least one of the pixels to transmit a signal. The pad is electrically connected to the signal transmission line. The pad has greater width than the signal transmission line. The buffer is disposed between the signal transmission line and the pad. A first end of the buffer adjacent to the pad is wider than a second end of the buffer adjacent to the signal transmission line.

9 Claims, 22 Drawing Sheets

METHOD OF MANUFACTURING DISPLAY APPARATUS

CROSS-REFERENCE TO RELATED APPLICATIONS

This is a divisional application based on pending application Ser. No. 13/963,273 filed Aug. 9, 2013, the entire contents of which is hereby incorporated by reference.

Korean Patent Application No. 10-2013-0031253, filed on Mar. 25, 2013 in the Korean Intellectual Property Office (KIPO), and entitled "DISPLAY APPARATUS AND METHOD OF MANUFACTURING THE SAME" is hereby incorporate in its entirety by reference.

BACKGROUND

1. Field

Example embodiments relate generally to a display apparatus and a method of manufacturing the display apparatus. More particularly, embodiments relate to a display apparatus capable of decreasing line defects and a method of manufacturing the display apparatus.

2. Description of the Related Art

A display apparatus may include an organic light emitting element, a thin film transistor for driving the organic light emitting element and a plurality of lines electrically connected to the thin film transistor and the organic light emitting element. The display apparatus actively generates light to display an image using the light having passed through the display apparatus. When a contaminant is present inside of the display apparatus, a dark spot as well as an electrical defect may be generated. The electrical defect and the dark spot deteriorate an image display quality of the display apparatus.

In order to prevent contaminants, the lines of the display apparatus are formed through wet etching. In the wet etching, the lines are patterned using liquid etchant so that contaminants are removed during the wet etching. Also, manufacturing cost may be decreased.

However, when the lines have various shapes are to be formed, exposure amounts of the lines to the liquid etchant may be different from each other. When the exposure amounts of the lines to the liquid etchant are different from each other, etching amounts of the lines are different from each other. When the etching amounts of the lines are different from each other, a portion of the lines may be insufficiently etched and another portion of the lines may be overetched. When the portion of the lines is overetched, thickness or width of the lines may be decreased or the lines may be disconnected.

When the lines are disconnected, the defect of disconnection may be easily recognized so that the display panel having the defect of disconnection may be discarded. However, as the thickness of the width of the lines is decreased, the defect may not be recognized by unaided eyes. Thus, the panel having the defect may continue to be processed through subsequent processes, increasing cost for inspection and manufacturing.

SUMMARY

Some example embodiments provide a display apparatus capable of decreasing line defects.

Some example embodiments also provide a method of manufacturing the display apparatus.

According to some example embodiments, a display apparatus includes a plurality of pixels, a signal transmission line, a pad and a buffer. The pixels display an image. The signal transmission line is electrically connected to at least one of the pixels to transmit a signal. The pad is electrically connected to the signal transmission line. The pad has greater width than the signal transmission line. The buffer is disposed between the signal transmission line and the pad. An end of the buffer adjacent to the pad has greater width than another end of the buffer adjacent to the signal transmission line.

In example embodiments, a side of the pad may not be perpendicular to a side of the buffer.

In example embodiments, the side of the buffer may be inclined with respect to a central line of the buffer.

In example embodiments, the side of the buffer may have a recessed shape toward a central line of the buffer.

In example embodiments, each of the pixels may include a thin film transistor, and the signal transmission line, the pad and the buffer may be formed from a same layer as a gate electrode of the thin film transistor.

In example embodiments, the signal transmission line, the pad and the buffer may include a gate line, a gate pad and a gate buffer, respectively.

In example embodiments, each of the pixels may include a thin film transistor, and the signal transmission line, the pad and the buffer may be formed from a same layer as source and drain electrodes of the thin film transistor.

In example embodiments, the signal transmission line, the pad and the buffer may include a data line, a data pad and a data buffer, respectively.

In example embodiments, the signal transmission line, the pad and the buffer may include a driving voltage line, a driving voltage pad and a driving voltage buffer, respectively.

In example embodiments, each of the pixels may include a first electrode, a second electrode and an organic light emitting element. The second electrode may correspond to the first electrode. The organic light emitting element may be interposed between the first and second electrodes. The signal transmission line, the pad and the buffer may be formed from a same layer as the first electrode.

In example embodiments, the signal transmission line, the pad and the buffer may include an initial voltage line, an initial voltage pad and an initial voltage buffer, respectively.

According to some example embodiments, in a method of manufacturing a display apparatus, the method is provided as follows. A conductive layer is formed on a base substrate. The conductive layer is patterned to form a signal transmission line, a pad and a buffer. The pad is electrically connected to the signal transmission line. The pad has greater width than the signal transmission line. The buffer is disposed between the signal transmission line and the pad. An end of the buffer adjacent to the pad has greater width than another end of the buffer adjacent to the signal transmission line. A plurality of pixels displaying an image is formed. At least one of the pixels is electrically connected to the signal transmission line.

In example embodiments, the conductive layer may be patterned by photolithography process including wet etching.

In example embodiments, a portion of the mask for patterning the conductive layer, which corresponds to the buffer, may have smaller width at a boundary between the signal transmission line and the buffer than a boundary between the pad and the buffer.

In example embodiments, the method may further include forming a thin film transistor on the base substrate. The thin film transistor may be electrically connected to the signal transmission line and the pixel. The signal transmission line, the pad and the buffer may be formed from a same layer as a gate electrode of the thin film transistor.

In example embodiments, the method may further include forming a thin film transistor on the base substrate. The thin film transistor may be electrically connected to the signal transmission line and the pixel. The signal transmission line, the pad and the buffer may be formed from a same layer as source and drain electrodes of the thin film transistor.

According to some example embodiments, in a method of manufacturing a display apparatus, the method is provided as follows. A plurality of signal transmission lines and a plurality of thin film transistors are formed on a base substrate. A conductive layer is formed on the base substrate on which the signal transmission lines and the thin film transistors are formed. The conductive layer is patterned to form a first electrode, a signal transmission line, a pad and a buffer. The pad is electrically connected to the signal transmission line. The pad has greater width than the signal transmission line. The buffer is disposed between the signal transmission line and the pad. An end of the buffer adjacent to the pad has greater width than another end of the buffer adjacent to the signal transmission line. An organic light emitting layer is formed on the first electrode. A second electrode is formed on the organic light emitting layer.

In example embodiments, the conductive layer may include reflective material.

In example embodiments, the conductive layer may include transparent conductive material.

In example embodiments, the signal transmission line, the pad and the buffer may include an initial voltage line, an initial voltage pad and an initial voltage buffer, respectively.

The signal transmission line may include various lines such as a scan line, a gate line, a data line, a driving voltage line, an initial voltage line, etc.

BRIEF DESCRIPTION OF THE DRAWINGS

Illustrative, non-limiting example embodiments will be more clearly understood from the following detailed description taken in conjunction with the accompanying drawings.

DETAILED DESCRIPTION

Figure 1:
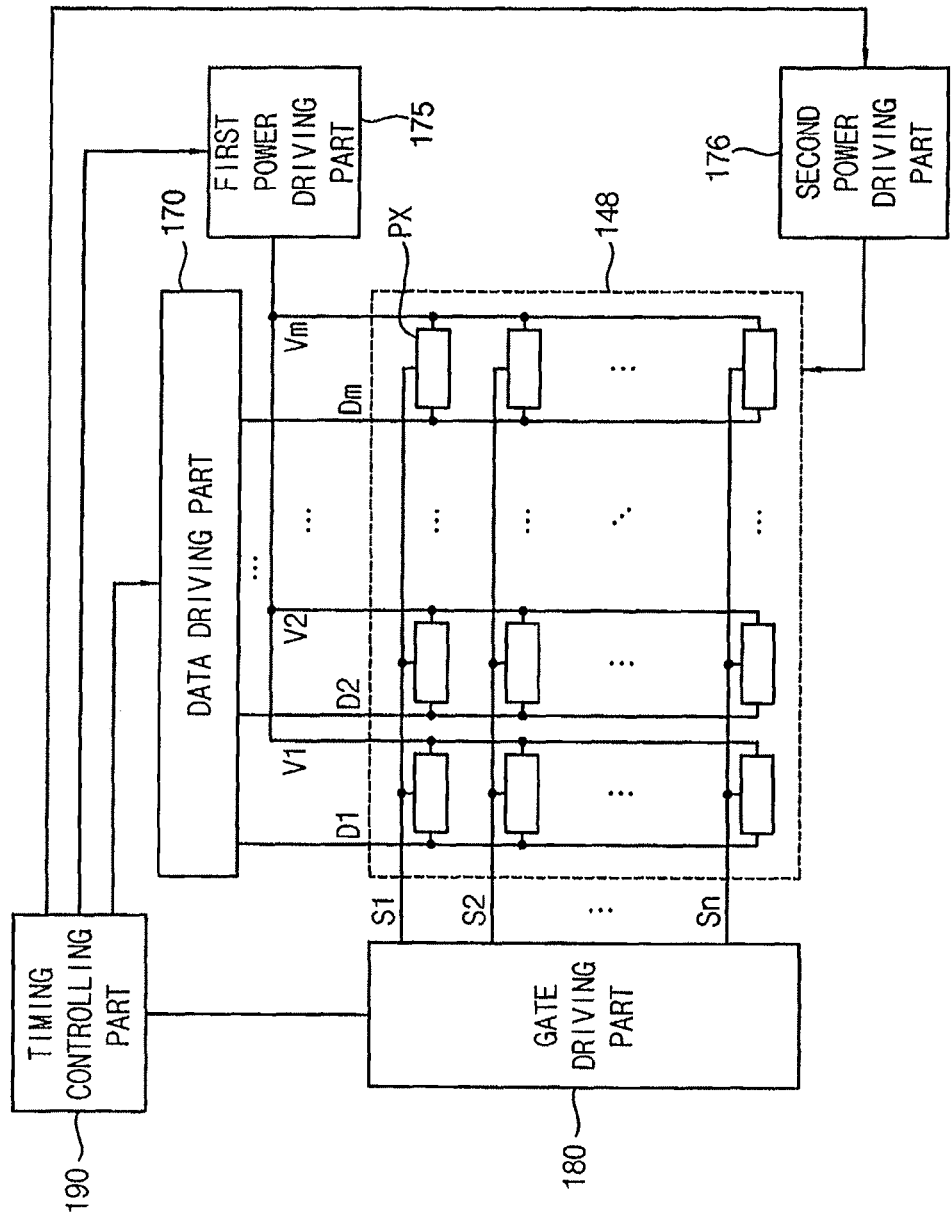
FIG. 1 is a plan view illustrating a display apparatus according to one example embodiment.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present disclosure to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings herein. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a plan view illustrating a display apparatus according to one example embodiment. Referring to FIG. 1, the display apparatus includes a plurality of pixels PX, a plurality of gate lines G1, G2, . . . Gn, a plurality of data lines D1, D2, . . . Dm, a plurality of driving voltage lines V1, V2, . . . Vm, a data driving part 170, a first power driving part 175, a second power driving part 176, a scan driving part 180, and a timing controlling part 190.

Each of the pixels PX displays an image based on a scan signal, a data signal, a driving voltage, and a second driving voltage. Each of the gate lines G1, G2, . . . Gn transmits the scan signal to the pixel PX. Each of the data lines D1, D2, . . . Dm transmits the data signal to the pixel PX. Each of the driving voltages V1, V2, . . . Vm transmits the first driving voltage from the first power driving part 175 to the pixel PX. A common electrode 148 applies the second driving voltage from the second power driving part 176 to the pixel PX. Alternatively, each of the pixels PX may include various display elements such as a liquid crystal element, an electrophoretic element, a plasma display element, etc.

The data driving part 170 applies the data signal to the data lines D1, D2, . . . Dm based on a data control signal from the timing controlling part 190.

The first power driving part 175 applies the driving voltage from the timing controlling part 190 to the driving voltage lines V1, V2, . . . Vm. The second power driving part 176 applies the second driving voltage from the timing controlling part 190 to the common electrode 148. When each of the pixels PX includes a voltage driving element, the first and second power driving parts 175 and 176 may be omitted. Examples of the voltage driving elements may include a liquid crystal element, an electrophoretic element, etc.

The gate driving part 180 applies the scan signal to the gate lines G1, G2, . . . Gn based on a gate control signal from the timing controlling part 190.

The timing controlling part 190 applies the data control signal, the driving voltage, the second driving voltage and the gate control signal to the data driving part 170, the first power driving part 175, the second power driving part 176, and the gate driving part 180, respectively.

Figure 2:
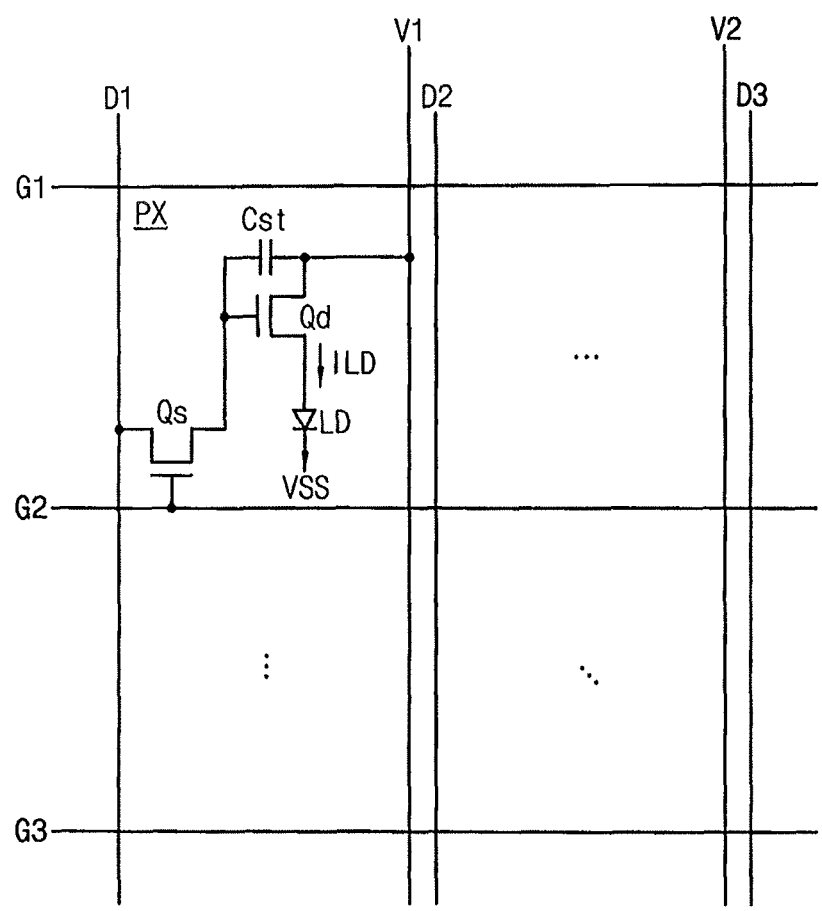
FIG. 2 is a circuit diagram illustrating a pixel of the display apparatus of FIG. 1.

FIG. 2 is a circuit diagram illustrating a pixel of the display apparatus of FIG. 1 according to an embodiment.

Referring to FIGS. 1 and 2, the pixels PX are electrically connected to the gate lines G1, G2, . . . Gn, the date lines D1, D2, . . . Dm and the driving voltage lines V1, V2, . . . Vm. Each of the pixels PX includes a switching transistor Qs, a driving transistor Qd, a storage capacitor Cst, and an organic light emitting element LD. The pixels PX are extended in a longitudinal direction of the display apparatus, and arranged in a matrix shape. Alternatively, the pixels PX may be arranged in a pentile arrangement, extended in a horizontal direction of the display apparatus, arranged in a rhombus shape, etc.

Each of the data lines D1, D2, . . . Gn may extend in a column direction of the display apparatus, and transmits the data signal to each of the pixels PX. For example, the column direction may be the longitudinal or vertical direction of the display apparatus. Each of the driving voltage line V1, V2, . . . Vm may extend in the column direction of the display apparatus, and transmits the driving voltage to each of the pixels PX. Each of the gate lines G1, G2, . . . Gn may extend in a row direction of the display apparatus, and transmits the scan signal to each of the pixels PX. For example, the row direction may be the horizontal direction of the display apparatus. Thus, the gate lines G1, G2, . . . Gn may extend in a direction substantially perpendicular to the data lines D1, D2, . . . Dm and the driving voltage lines V1, V2, . . . Vm.

The switching transistor Qs includes a control electrode, an input electrode, and an output electrode. The control electrode of the switching transistor Qs is electrically connected to one of the gate line G1, G2, . . . Gn. The input electrode of the switching transistor Qs is electrically connected to one of the date lines D1, D2, . . . Dm. The output electrode of the switching transistor Qs is electrically connected to the driving transistor Qd. The switching transistor Qs applies the data signal from the date line D1, D2, . . . Dm to the driving transistor Qd based on the scan signal from the gate line G1, G2, . . . Gn.

The driving transistor Qd includes a control electrode, an input electrode, and an output electrode. The control electrode of the driving transistor Qd is electrically connected to the output electrode of the switching transistor Qs. The input electrode of the driving transistor Qd is electrically connected to one of the driving voltage line V1, V2, . . . Vm. The output electrode of the driving transistor Qd is electrically connected to the organic light emitting element LD. The driving transistor Qd applies an output current ILD. An amount of the output current ILD varies based on the voltage applied between the control electrode and the output electrode of the driving transistor Qd.

The storage capacitor Cst is electrically connected between the control electrode and the input electrode of the driving transistor Qd. The storage capacitor Cst is charged by the data signal applied to the control electrode of the driving transistor Qd, and maintains the charged voltage after the switching transistor Qs is turned off.

The organic light emitting element LD includes an anode and a cathode. The anode of the organic light emitting element LD is electrically connected to the output electrode of the driving transistor Qd. The cathode of the organic light emitting element LD receives a common voltage Vss. The organic light emitting element LD generates light based on the output current ILD of the driving transistor to display an image. The amount of the output current ILD corresponds to luminance of light displayed on each of the pixels PX.

In the particular example described above, each of the pixels PX includes two transistors Qs and Qd, one capacitor Cst, and one light emitting element LD. Alternatively, the number of the elements and connection in each pixel PX may be changed.

Figure 3:
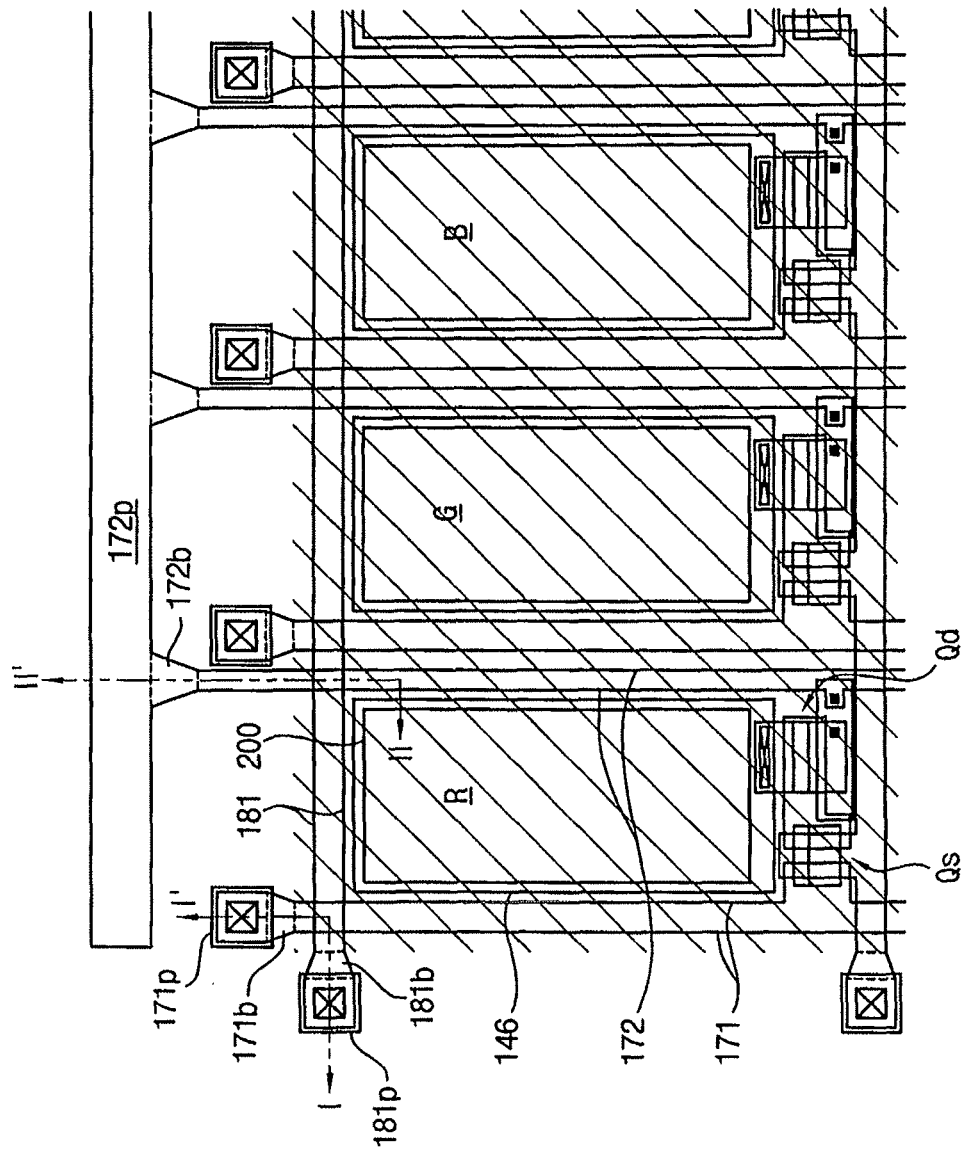
FIG. 3 is an enlarged plan view illustrating a portion of the display apparatus of FIG. 1.
Figure 4:
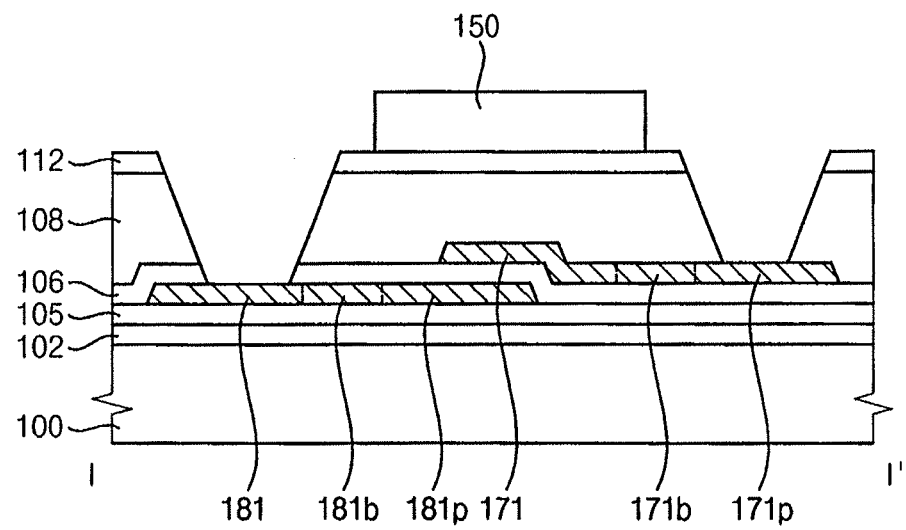
FIG. 4 is a cross-sectional view taken along a line I-I' of FIG. 3.
Figure 5:
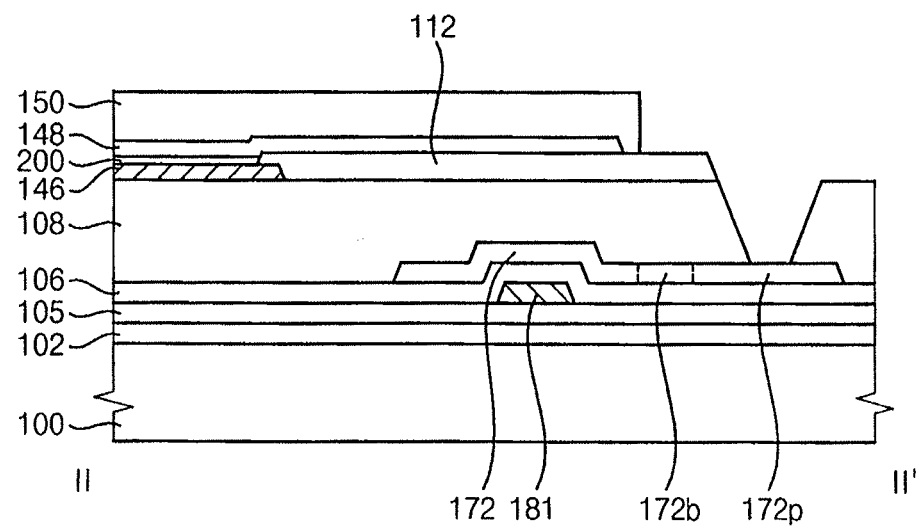
FIG. 5 is a cross-sectional view taken along a line II-II' of FIG. 3.

FIG. 3 is an enlarged plan view illustrating a portion of the display apparatus of FIG. 1. FIG. 4 is a cross-sectional view taken along a line I-I' of FIG. 3. FIG. 5 is a cross-sectional view taken along a line II-II' of FIG. 3.

Referring to FIGS. 3 to 5, the display apparatus includes a base substrate 100, a buffer layer 102, a gate insulating layer 104, an insulating interlayer 106, a planarizing layer 108, a pixel defining layer 112, the switching transistor Qs, the driving transistor Qd, a first electrode 146, the common or second electrode 148, a protecting layer 150, an organic light emitting layer 200, the date line 171, a date buffer 171b, a data pad 171p, the driving voltage line 172, a driving voltage buffer 172b, a driving voltage pad 172p, the gate line 181, a gate buffer 181b, and a gate pad 181p. The data line 171 may be one of the data lines D1, D2, . . . Dm of FIG. 1. The driving voltage line 172 may be one of the driving voltage lines V1, V2, . . . Vm of FIG. 1. The gate line 181 may be one of the gate lines G1, G2, . . . Gn of FIG. 1. For example, the display apparatus may further include the date driving part 170 (shown in FIG. 1), the first power driving part 175 (shown in FIG. 1), the second power driving part 176 (shown in FIG. 1), the scan driving part 180 (shown in FIG. 1), and the timing controlling part 190 (shown in FIG. 1).

The base substrate 100 may include a transparent insulating substrate. For example, the base substrate 100 may include a glass substrate, a quartz substrate, a transparent resin substrate, etc. Examples of transparent resin that may be used for the transparent resin substrate may include polyimide resin, acrylic resin, polyacrilate resin, polycarbonate resin, polyether resin, polyethyleneterephthalate resin, sulfonic resin, etc.

The buffer layer 102 is disposed on the base substrate 100 to prevent diffusion of metal atoms or impurities from the base substrate 100. Also, the buffer layer 102 controls the speed of heat transfer during subsequent crystallizing process for forming an active pattern, thereby increasing uniformity of the active pattern. In addition, when a surface of the base substrate 100 is non-uniform, the buffer layer 102 increases the uniformity of the surface of the base substrate 100.

The buffer layer 102 may include silicon compound. Examples of the silicon compound that may be used for the buffer layer 102 may include silicon oxide (SiOx), silicon nitride (SiNx), silicon oxynitride (SiOxNy), silicon carbon oxide (SiOxCy), silicon carbon nitride (SiCxNy), etc. These can be used alone or in a combination thereof. The buffer layer 102 may be formed on the base substrate 100 through a spin coating, a chemical vapor deposition (CVD), a plasma enhanced chemical vapor deposition (PECVD), high definition plasma-chemical deposition (HDP-CVD), printing, etc. Also, the buffer layer 102 may have a mono layered structure or a multi-layered structure including the silicon compound. Examples of the mono layered structure or the multi-layered structure of the buffer layer 102 may include silicon oxide (SiOx), silicon nitride (SiNx), silicon oxynitride (SiOxNy), silicon carbon oxide (SiOxCy), silicon carbon nitride (SiCxNy), etc.

The active pattern (not shown) may be formed on the buffer layer 102. For example, a semiconductor layer (not shown) may be formed on the buffer layer 102, and the semiconductor layer (not shown) may be patterned to form a preliminary semiconductor layer (not shown). The preliminary semiconductor layer (not shown) may be crystallized to form the active pattern (not shown). For example, the crystallizing for forming the active pattern from the preliminary semiconductor layer may include irradiating layer, heat treating, heat treating using catalyst, etc.

The gate insulating layer 104 is disposed on the buffer layer 102 on which the active pattern (not shown) is formed. The gate insulating layer 104 may be formed through chemical vapor deposition, spin coating, plasma enhanced chemical vapor deposition, sputtering, vacuum deposition, high definition plasma-chemical vapor deposition, printing, etc. Also, the gate insulating layer 104 may include silicon oxide, metal oxide, etc. Examples of the metal oxide that may be used for the gate insulating layer 104 may include hafnium oxide (FfOx), aluminum oxide (AlOx), zirconium oxide (ZrOx), titanium oxide (TiOx), tantalum oxide (TaOx), etc. These can be used alone or in a combination thereof.

A gate electrode (not shown) of the switching transistor Qs, a gate electrode (not shown) of the driving transistor Qd, the gate line 181, the data buffer 181b, and the gate pad 181p are formed on the gate insulating layer 104. For example, a first conductive layer (not shown) may be formed on the gate insulting layer 104 and then patterned through a photolithography process or an etching process using an etching mask to form the gate electrodes (not shown), the gate line 181, the gate buffer 181b, and the gate pad 181p. The first conductive layer may be formed through printing, sputtering, chemical vapor deposition, pulse laser deposition (PLD), vacuum deposition, atomic layer deposition (ALD), etc.

The gate electrodes (not shown), the gate line 181, the gate buffer 181b, and the gate pad 181p may include metal, alloy, metal nitride, conductive metal compound, transparent conductive material, etc. For example, the gate electrodes (not shown), the gate line (181), the gate buffer 181b and the gate pad 181p may include aluminum, alloy including aluminum, aluminum nitride (AlNx), silver (Ag), alloy including silver, tungsten (W), tungsten nitride (WNx), copper (Cu), alloy including copper, nickel (Ni), chromium (Cr), chromium nitride (CrNx), molybdenum (Mo), alloy including molybdenum, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), indium tin oxide (ITO), tin oxide (SnOx), indium oxide (InOx), gallium oxide (GaOx), indium zinc oxide (IZO), etc. These can be used alone or in a combination thereof. Alternatively, the gate electrodes (not shown), the gate line 181, the gate buffer 181b, and the gate pad 181p may have a mono-layered structure or a multi-layered structure including a metal layer, an alloy layer, a metal nitride layer, a conductive metal oxide layer, and/or a transparent conductive layer.

The gate pad 181p is disposed adjacent to an end of the gate line 181. The gate pad 181p is electrically connected to the gate line 181 through the gate buffer 181b.

The gate buffer 181b is interposed between the gate line 181 and the gate pad 181p to electrically connect the gate pad 181p to the gate line 181. A first end of the gate buffer 181b adjacent to the gate line 181 is narrower than a second end of the gate buffer 181b adjacent to the gate pad 181p. For example, a side of the gate pad 181p may not be perpendicular to a side of the gate buffer 181b, i.e., the side of the gate buffer 181b is inclined with respect to the boundary between the gate pad 181p and the gate buffer 181b. In other words, the gate buffer 181b may be tapered, e.g., linearly tapered, between the second end and the first end. When the gate buffer 181b is wider than the gate line 181, resistance between the gate pad 181p and the gate line 181 is not increased even if the gate buffer 181b is overetched during manufacturing process.

The insulating interlayer 106 is disposed on the gate insulating layer 104 on which the gate electrodes (not shown), the gate line 181, the gate buffer 181b, and the gate pad 181p to electrically insulate the gate electrodes (not shown), the gate line 181, the gate buffer 181b, and the gate pad 181p from the input and output electrodes of the switching transistor Qs, the input and output electrodes of the driving transistor Qd, the data line 171, the data buffer 171b, the data pad 171p, the driving voltage line 172, the driving voltage buffer 172b, and the driving voltage pad 172p.

The insulating interlayer 106 may include a silicon compound. For example, the insulating interlayer 106 may include silicon oxide, silicon nitride, silicon oxynitride, silicon carbon oxide, silicon carbon nitride, etc. These can be used alone or in a combination thereof. The insulating interlayer 106 may include a plurality of contact holes (not shown) through which the active pattern (not shown) is partially exposed.

The input and output electrodes of the switching transistor Qs, the input and output electrodes of the driving transistor Qd, the data line 171, the data buffer 171b, the data pad 171p, the driving voltage line 172, the driving voltage buffer 172b, and the driving voltage pad 172p may be disposed on the insulating interlayer 106. The input and output electrodes of the switching transistor Qs and the input and output electrodes of the driving transistor Qd make contact with the active pattern (not shown) through the contact holes (not shown), respectively.

The input and output electrodes of the switching transistor Qs, the input and output electrodes of the driving transistor Qd, the data line 171, the data buffer 171b, the data pad 171p, the driving voltage line 172, the driving voltage buffer 172b, and the driving voltage pad 172p may include metal, alloy, metal nitride, conductive metal oxide, transparent conductive material, etc. For example, the input and output electrodes of the switching transistor Qs, the input and output electrodes of the driving transistor Qd, the data line 171, the data buffer 171b, the data pad 171p, the driving voltage line 172, the driving voltage buffer 172b, and the driving voltage pad 172p may include aluminum, alloy including aluminum, aluminum nitride (AlNx), silver (Ag), alloy including silver, tungsten (W), tungsten nitride (WNx), copper (Cu), alloy including copper, nickel (Ni), chromium (Cr), chromium nitride (CrNx), molybdenum (Mo), alloy including molybdenum, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), indium tin oxide (ITO), tin oxide (SnOx), indium oxide (InOx), gallium oxide (GaOx), indium zinc oxide (IZO), etc. These can be used alone or in a combination thereof.

The data line 171 may be formed from a same layer as the input and output electrodes of the switching transistor Qs to be electrically connected to the input electrode of the switching transistor Qs.

The data pad 171p is disposed adjacent to an end of the data line 171. The data pad 171p is electrically connected to the data line 171 through the data buffer 171b.

The data buffer 171b is interposed between the data line 171 and the data pad 171p to electrically connect the data pad 171p to the data line 171. A first end of the data buffer 171b adjacent to the data line 171 is narrower than a second end of the data buffer 171b adjacent to the data pad 171p. For example, a side of the data pad 171p may not be perpendicular to a side of the data buffer 171b, e.g., may be is inclined with respect to the boundary between the data pad 171p and the data buffer 171b. In other words, the data buffer 171b may be tapered, e.g., linearly tapered, between the second end and the first end. When the data buffer 171b is wider than the data line 171, resistance between the data pad 171p and the data line 171 is not increased even if the data buffer 171b is overetched during manufacturing.

The driving voltage line 172 may be formed from a same layer as the input and output electrodes of the driving transistor Qd to be electrically connected to the input electrode of the switching transistor Qd.

The driving voltage pad 172p is disposed adjacent to an end of the driving voltage line 172. The driving voltage pad 172p is electrically connected to the driving voltage line 172 through the driving voltage buffer 172b.

The driving voltage buffer 172b is interposed between the driving voltage line 172 and the driving voltage pad 172p to electrically connect the driving voltage pad 172p to the driving voltage line 172. A first end of the driving voltage buffer 172b adjacent to the driving voltage line 172 is narrower than a second end of the driving voltage buffer 172b adjacent to the driving voltage pad 172p. For example, a side of the driving voltage pad 172p may not be perpendicular to a side of the driving voltage buffer 172b, i.e., may be inclined with respect to the boundary between the driving voltage pad 172p and the driving voltage buffer 172b. In other words, the driving voltage buffer 172b may be tapered, e.g., linearly tapered, between the second end and the first end. When the driving voltage buffer 172b is wider than the driving voltage line 172, resistance between the driving voltage pad 172p and the driving voltage line 172 is not increased even if the driving voltage buffer 172b is overetched during manufacturing.

The planarizing layer 108 may be formed on the insulating interlayer 106 on which the input and output electrodes, the data line 171, the data buffer 171b, the data pad 171p, the driving voltage line 172, the driving voltage buffer 172b, and the driving voltage pad 172p are formed. The planarizing layer 108 insulates the input and output electrodes, the data line 171, the data buffer 171b, the data pad 171p, the driving voltage line 172, the driving voltage buffer 172b, and the driving voltage pad 172p from the first electrode 146.

The planarizing layer 108 may include organic insulating material or inorganic insulating material. For example, the planarizing layer 108 may include photoresist, acrylic resin, polyimide resin, polyamide resin, siloxane resin, photosensitive acrylic carboxyl resin, novolak resin, alkaline soluble resin, silicon oxide, silicon nitride, silicon oxynitride, silicon carbon oxide, silicon carbon nitride, etc. These can be used alone or in a combination thereof.

The planarizing layer 108 has a contact hole through which the output electrode of the driving transistor Qd is exposed.

The first electrode 146 may be disposed on the planarizing layer 108 corresponding to the pixel region to be electrically connected to the output electrode of the driving transistor Qd through the contact hole of the planarizing layer 108.

When the display apparatus is a front illumination type, the first electrode 146 may include metal having high reflectivity, alloy having high reflectivity, etc. For example, the first electrode 146 may include aluminum, silver, platinum, gold (Au), chromium, tungsten, molybdenum, titanium, palladium (Pd), iridium (Ir), an alloy thereof, etc. These can be used alone or in a combination thereof. Alternatively, when the display apparatus is a rear illumination type, the first electrode 146 may include transparent conductive material, e.g., indium tin oxide, tin oxide, indium zinc oxide, zinc oxide, indium gallium oxide, gallium oxide, etc. These can be used alone or in a combination thereof.

The pixel defining layer 112 may be disposed on the planarizing layer 108 on which the first electrode 146 is formed. The pixel defining layer 112 partially exposes the first electrode 146. The pixel defining layer 112 may include organic material or inorganic material. For example, the pixel defining layer 112 may include photoresist, polyacrylic resin, polyimide resin, acrylic resin, silicon compound, etc. The pixel defining layer 112 defines the display region and the non-display region based on the exposed portion of the first electrode 146. For example, the display region corresponds to the exposed portion of the first electrode 146. The non-display region may correspond to the unexposed portion of the display apparatus.

The organic light emitting element 200 may be disposed on the portion of the first electrode 146 exposed by the pixel defining layer 112. The second electrode 148 may cover the organic light emitting element 200 and the pixel defining layer 112.

When the organic light emitting display apparatus is the front illumination type, the second electrode 148 may include the transparent conductive material such as indium tin oxide, tin oxide, indium zinc oxide, zinc oxide, indium gallium oxide, gallium oxide, etc. These can be used alone or in a combination thereof. Alternatively, when the organic light emitting display apparatus is the rear illumination type, the second electrode 148 may include the highly reflective metal, an alloy having high reflectivity, etc.

FIGS. 6A, 7A, 8A, 9A, and 10A are plan views illustrating a method of manufacturing the display apparatus of FIG. 3. FIGS. 6B, 6C, 7B, 7C, 8B, 8C, 9B, 9C, 10B, and 10C are cross-sectional views illustrating a method of manufacturing the display apparatus of FIG. 3.

Figure 6A:
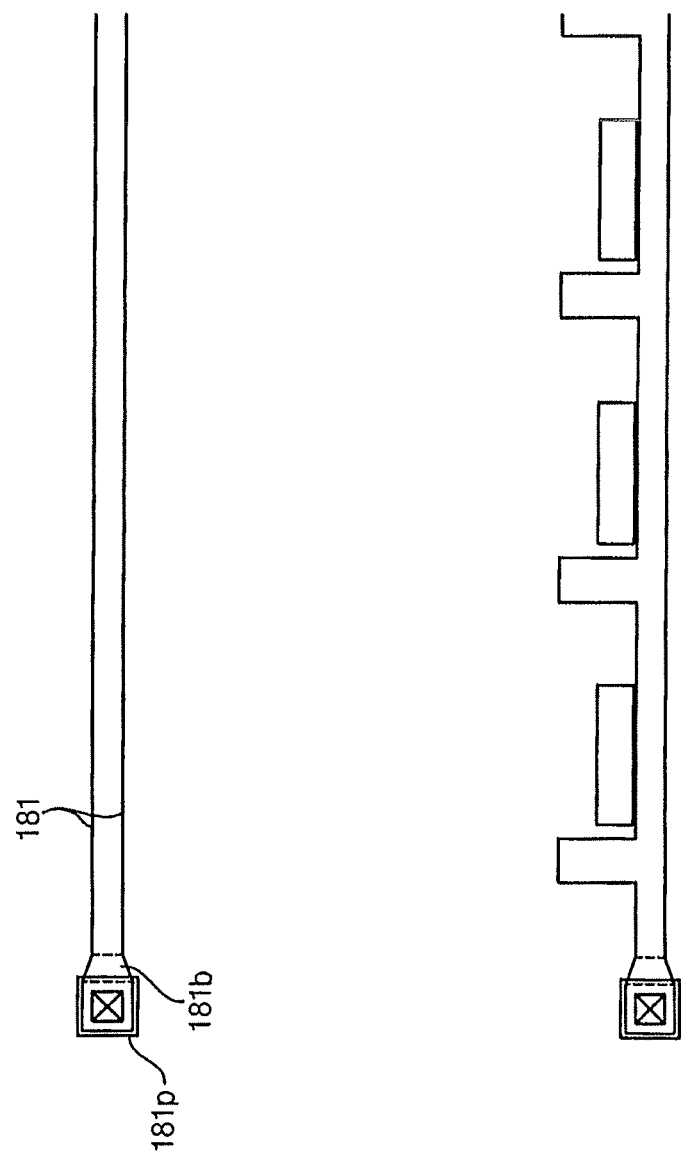
FIGS. 6A, 7A, 8A, 9A and 10A are plan views illustrating stages in a method of manufacturing the display apparatus of FIG. 3.
Figure 6B:
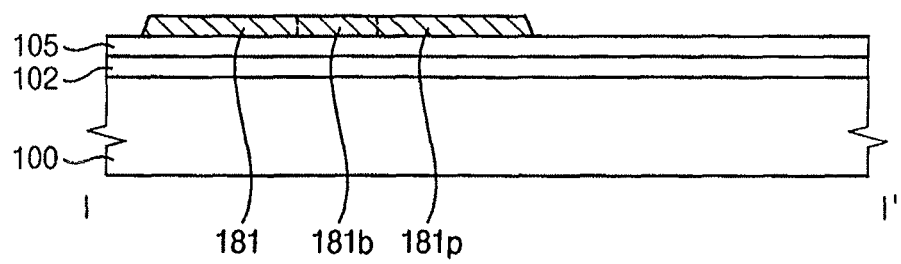
FIGS. 6B, 6C, 7B, 7C, 8B, 8C, 9B, 9C, 10B and 10C are cross-sectional views illustrating stages in a method of manufacturing the display apparatus of FIG. 3.
Figure 6C:
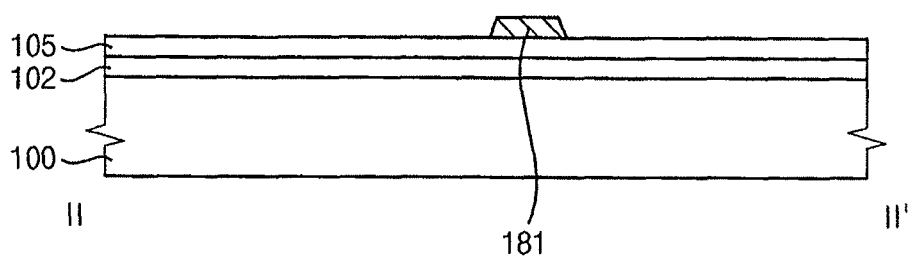

Referring to FIGS. 6A, 6B, and 6C, the buffer layer 102 is formed on the base substrate 100. The buffer layer 102 is formed on the base substrate 100 through the spin coating, the chemical vapor deposition (CVD), the plasma enhanced chemical vapor deposition (PECVD), the high definition plasma-chemical vapor deposition (HDP-CVD), the printing, etc.

The active pattern (not shown) is formed on the buffer layer 102.

The gate insulating layer 104 is formed on the buffer layer 102 on which the active pattern (not shown) is formed. The gate insulating layer 104 is formed through a chemical vapor deposition, the spin coating, the plasma enhanced chemical vapor deposition, the sputtering, the vacuum deposition, the high definition plasma-chemical vapor deposition, the printing, etc.

The gate electrode (not shown) of the switching transistor Qs, the gate electrode (not shown) of the driving transistor Qd, the gate line 181, the gate buffer 181b and the gate pad 181p are formed on the gate insulating layer 104. For example, the first conductive layer (not shown) is formed on the gate insulating layer 104, and thus the first conductive layer is patterned through the photolithography process or the wet etching using additional etching mask to form the gate electrodes (not shown), the gate line 181, the gate buffer 181b, and the gate pad 181p.

For example, a portion of the mask for patterning the first conductive layer (not shown), which corresponds to the gate buffer 181b, is narrower at a boundary between the gate line 181 and the gate buffer 181b than at a boundary between the gate pad 181p and the gate buffer 181b. That is, the side of the gate buffer 181b is not perpendicular to the boundary between the gate pad and the data buffer 181b. When the gate buffer 181b is wider than the gate line 181, a minimum width between the gate pad 181p and the gate line 181 is maintained, thereby preventing thinning of the gate buffer 181b to be thinner than the gate line 181 or disconnection between the gate pad 181p and the gate line 181.

Figure 7A:
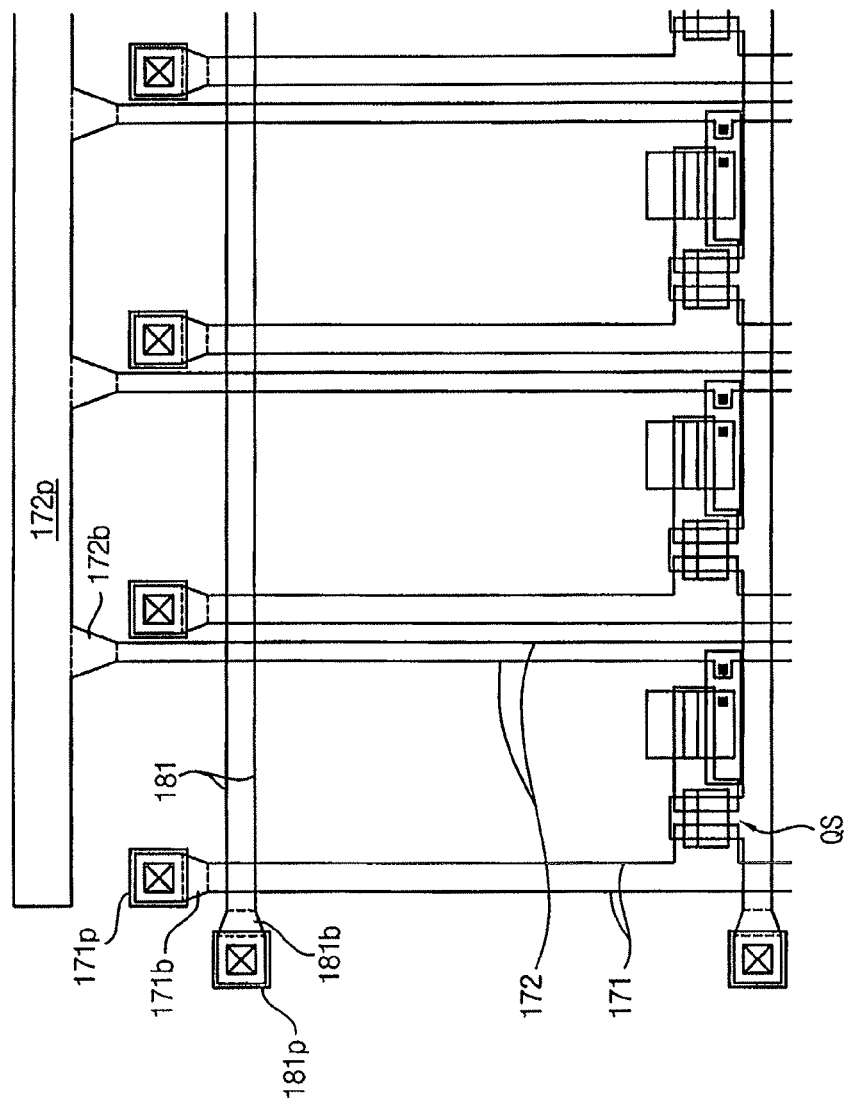
Figure 7B:
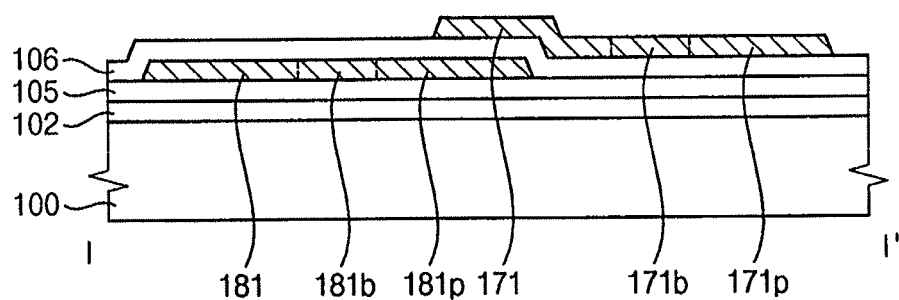
Figure 7C:
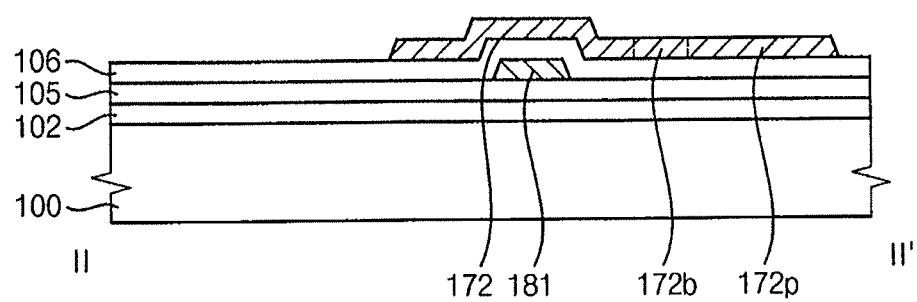

Referring to FIGS. 7A, 7B, and 7C, the insulating interlayer 106 is formed on the gate insulating layer 104 on which the gate electrodes (not shown), the gate line 181, the gate buffer 181b, and the gate pad 181p are formed.

The insulating interlayer 106 may be partially etched to form the contact holes (not shown) through which the active pattern (not shown) is partially exposed.

The input and output electrodes of the switching transistor Qs, the input and output electrodes of the driving transistor Qd, the data line 171, the data buffer 171b, the data pad 171p, the driving voltage line 172, the driving voltage buffer 172b, and the driving voltage pad 172p are formed on the insulating interlayer 106. The input and output electrodes are electrically connected to the active pattern (not shown) through the contact holes.

For example, a second conductive layer (not shown) is formed on the insulating interlayer 106, and thus the second conductive layer (not shown) is patterned using a photolithography process or a wet etching using an additional etching mask to form the input and output electrodes, the data line 171, the data buffer 171b, the data pad 171p, the driving voltage line 172, the driving voltage buffer 172b, and the driving voltage pad 172p.

For example, a portion of the mask for patterning the second conductive layer (not shown), which corresponds to the data buffer 171b, is narrower at a boundary between the data line 171 and the data buffer 171b than at a boundary between the data pad 171p and the data buffer 171b. That is, the side of the data buffer 171b is not perpendicular to the boundary between the data pad and the data buffer 171b. When the data buffer 171b is wider than the data line 171, a minimum width between the data pad 171p and the data line 171 is maintained, thereby preventing thinning of the data buffer 171b to be thinner than the data line 171 or disconnection between the data pad 171p and the data line 171.

In addition, a portion of the mask for patterning the second conductive layer (not shown), which corresponds to the driving voltage buffer 172b, is narrower at a boundary between the driving voltage line 172 and the driving voltage buffer 172b than at a boundary between the driving voltage pad 172p and the driving voltage buffer 172b. That is, the side of the driving voltage buffer 172b is not perpendicular to the boundary between the driving voltage pad and the data buffer 172b. When the driving voltage buffer 172b is wider than the driving voltage line 172, a minimum width between the driving voltage pad 172p and the driving voltage line 172 is maintained, thereby preventing thinning of the driving voltage buffer 172b to be thinner than the driving voltage line 172 or disconnection between the driving voltage pad 172p and the driving voltage line 172.

Figure 8A:
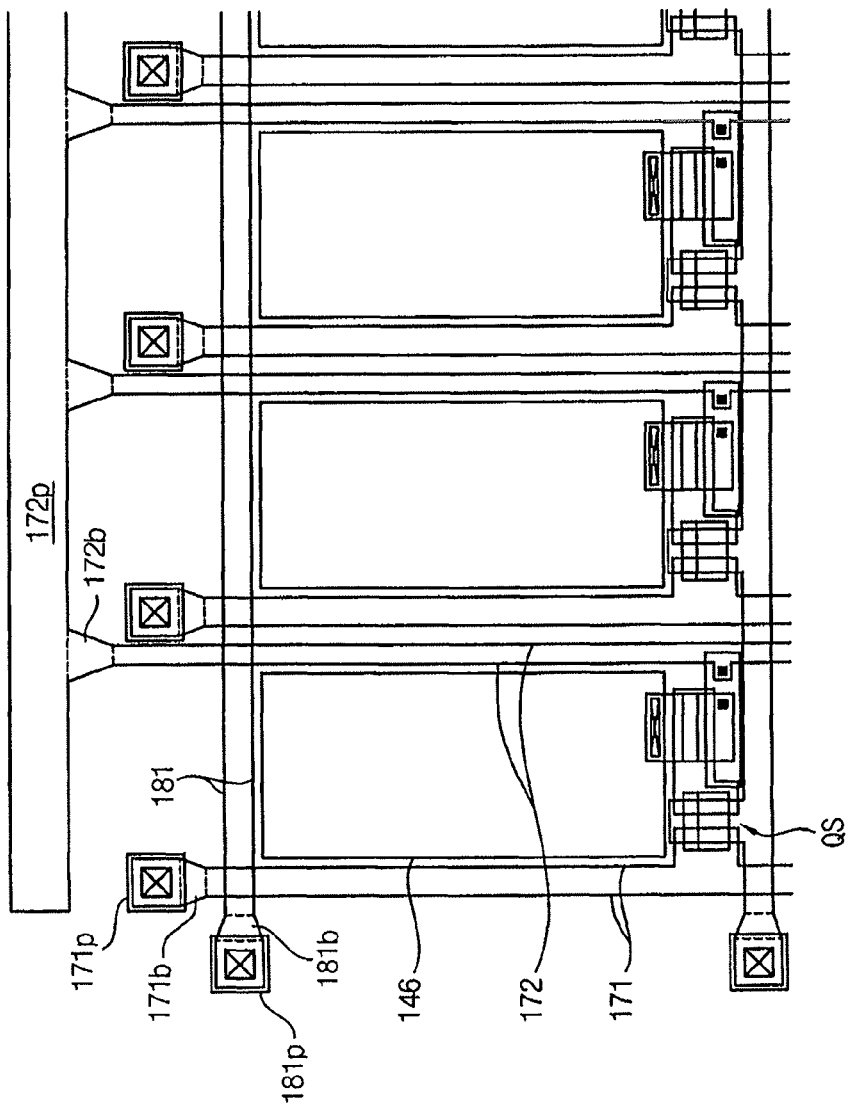
Figure 8B:
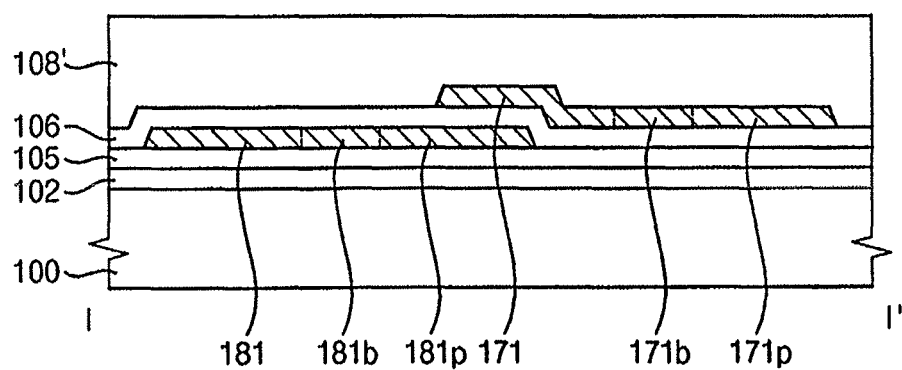
Figure 8C:
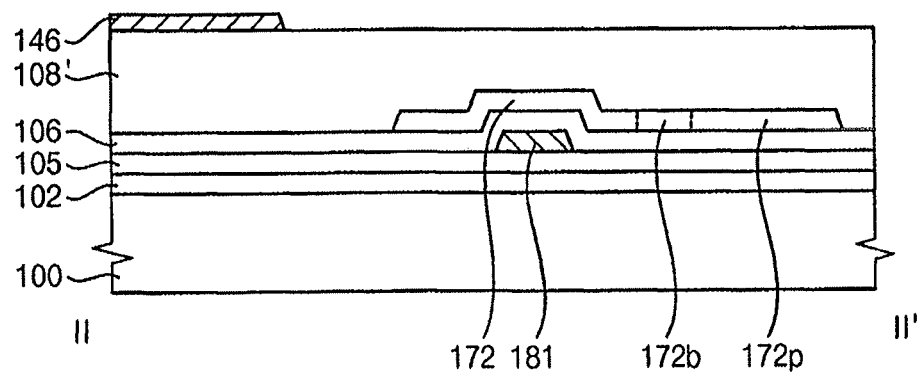

Referring to FIGS. 8A, 8B, and 8C, an initial planarizing layer 108' is formed on the insulating interlayer 106 on which the input and output electrodes, the data line 171, the data buffer 171b, the data pad 171p, the driving voltage line 172, the driving voltage buffer 172b, and the driving voltage pad 172p are formed.

The initial planarizing layer 108' is partially etched to form the planarizing layer 108 having a contact hole (not shown) through the output electrode of the driving transistor Qd is exposed.

The first electrode 146 is formed on the planarizing layer 108 corresponding to the pixel region. The first electrode 146 is electrically connected to the output electrode of the driving transistor Qd through the contact hole of the planarizing layer 108.

For example, a third conductive layer (not shown) is formed on the planarizing layer 108, and thus the third conductive layer (not shown) is patterned through a photolithography process of a wet etching using an additional etching mask to form the first electrode 146.

Figure 9A:
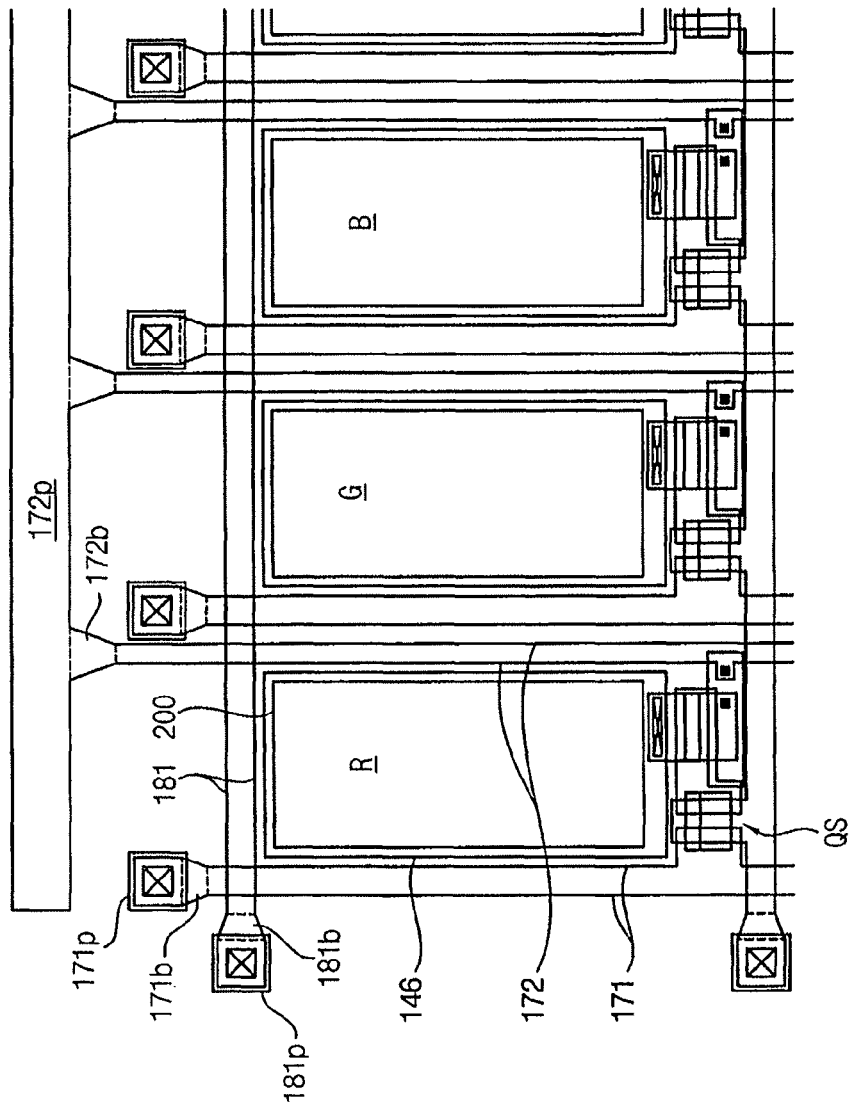
Figure 9B:
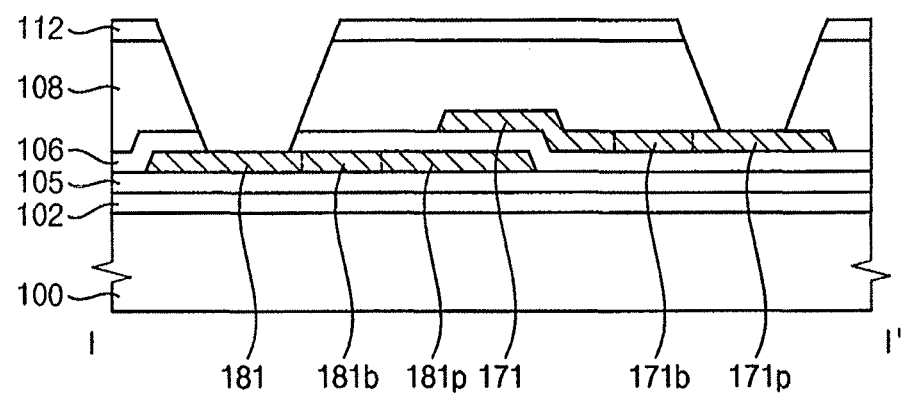
Figure 9C:
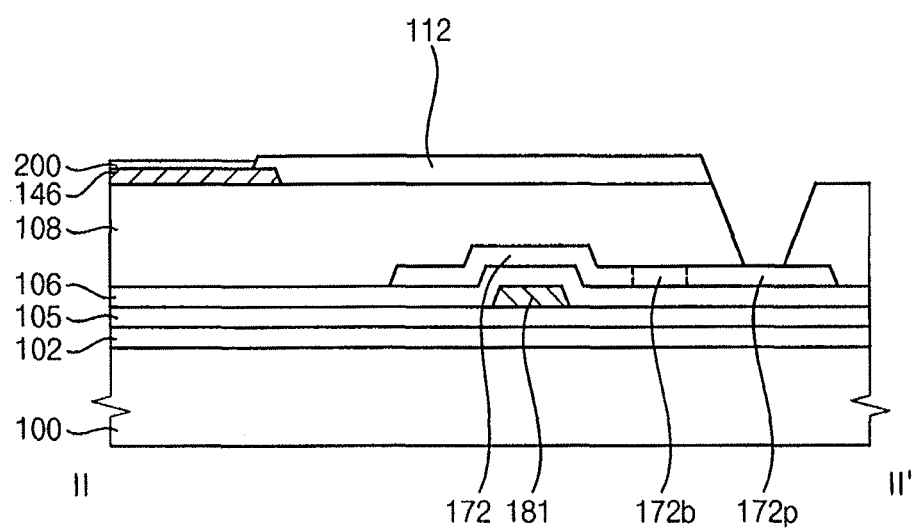

Referring to FIGS. 9A, 9B, and 9C, an insulating layer (not shown) is formed on the planairzing layer 108 on which the first electrode 146 is formed, and thus the insulating layer (not shown) is patterned to form the pixel defining layer 112. Thus, the pixel defining layer 112 partially exposes the first electrode 146 and defines the pixel region corresponding to the pixel PX (shown in FIG. 1).

The pixel defining layer 112 and the planarizing layer 108 may be partially etched to partially expose the gate pad 181p, the data pad 171p, and the driving voltage pad 172p.

The organic light emitting element 200 is formed on the first electrode 146 which is exposed by the pixel defining layer 112.

Figure 10A:
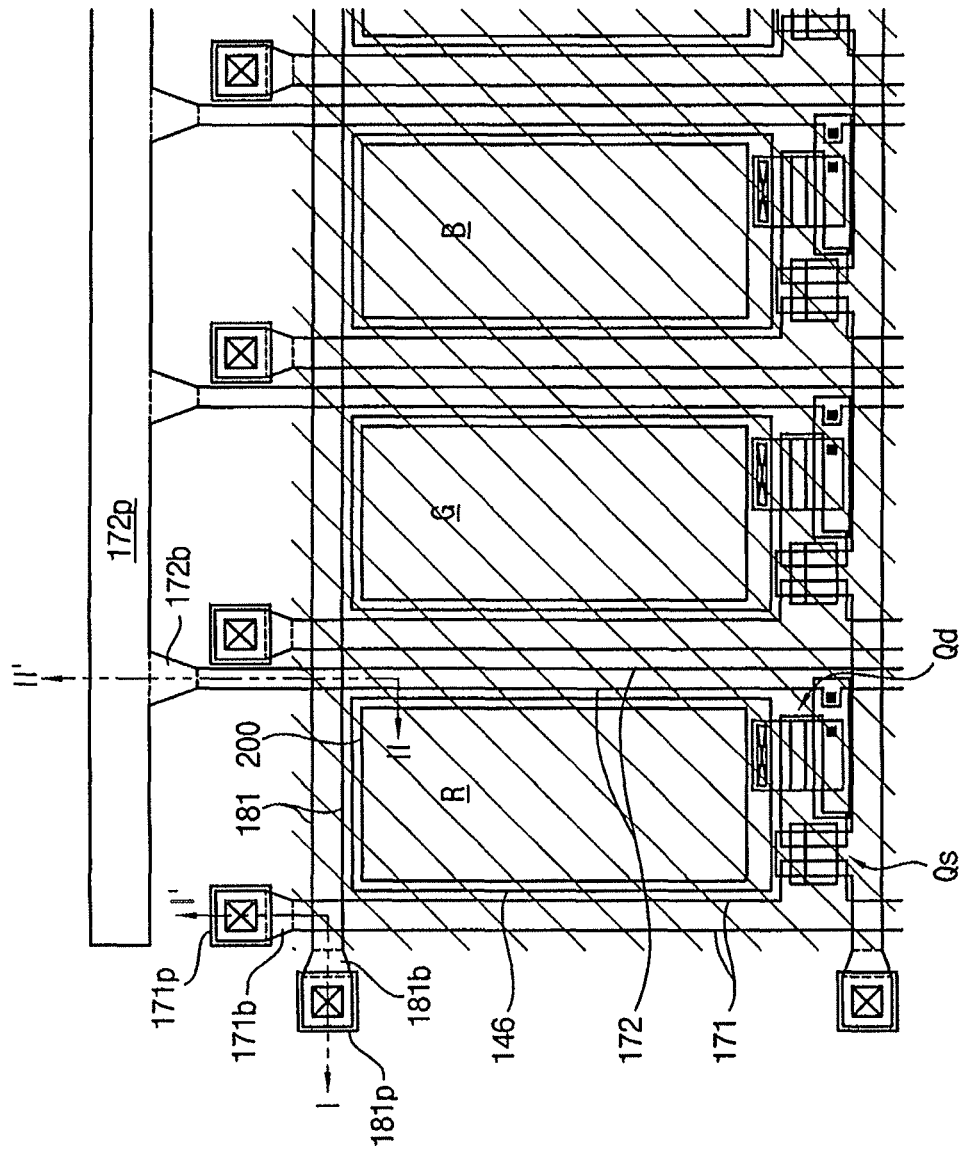
Figure 10B:
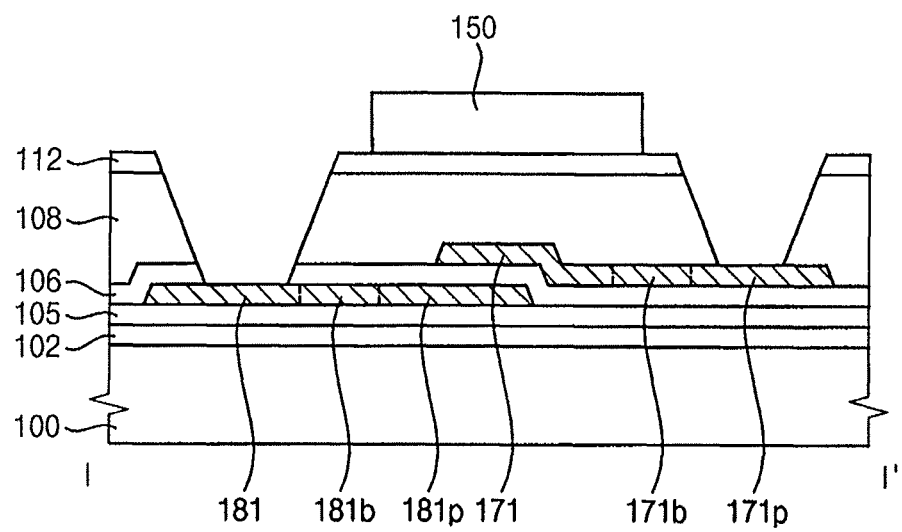
Figure 10C:
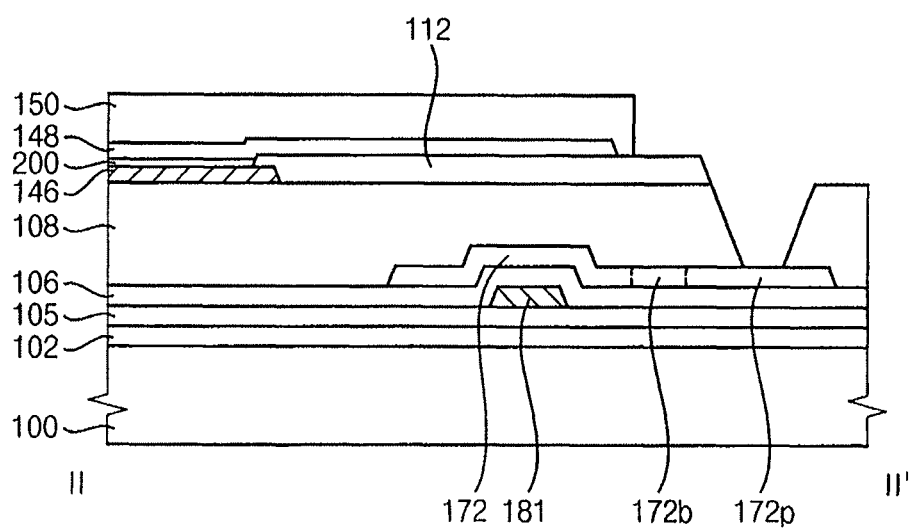

Referring to FIGS. 10A, 10B and 10C, a fourth conductive layer (not shown) is formed on the organic light emitting element 200 and the pixel defining layer 112. The fourth conductive layer (not shown) is patterned through a photolithography using a mask to form the second electrode 148.

The protecting layer 150 is formed on the pixel defining layer 112 on which the second electrode 148 and the organic light emitting layer 200 are formed.

According to the present example embodiment, the gate buffer 181b is interposed between the gate line 181 and the gate pad 181p, the data buffer 171b is interposed between the data line 171 and the data pad 171p, and the driving voltage buffer 172b is interposed between the driving voltage line 172 and the driving voltage pad 172p. In addition, each of the buffers 181b, 171b, and 172b may be wider adjacent to each of the pads 181p, 171p, and 172p than adjacent to each of the lines 181, 171 and 172. Thus, the pads 181p, 171p, and 172p are securely electrically connected to the lines 181, 171, and 172 even if the pads 181b, 171b, and 172b are overetched during the wet etching.

Figure 11:
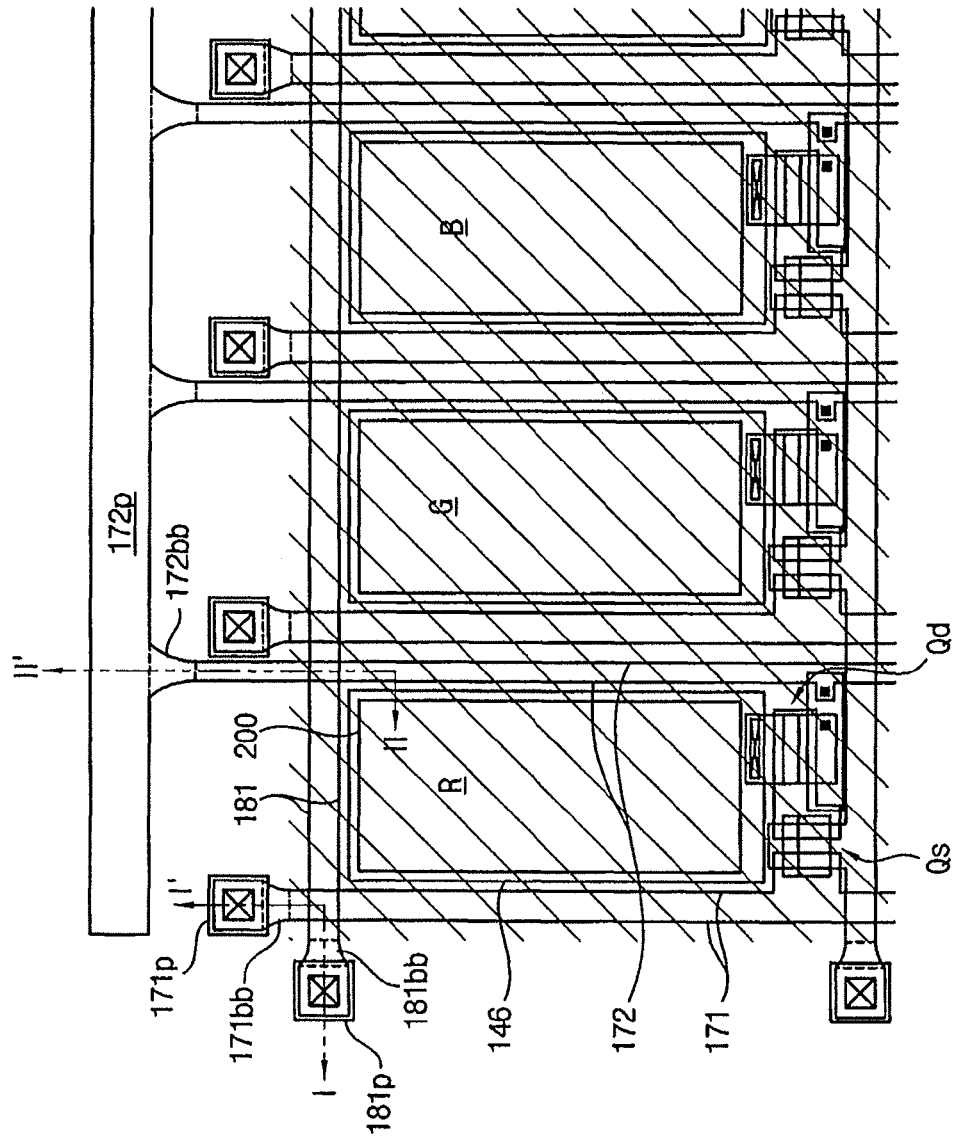
FIG. 11 is a plan view illustrating a display apparatus according to another example embodiment.

FIG. 11 is a plan view illustrating a display apparatus according to another example embodiment. The display apparatus of FIG. 11 is substantially the same as shown in FIGS. 1 to 10C except the buffers. Thus, any repetitive explanations concerning the same elements will be omitted.

Referring to FIG. 11, a gate buffer 181bb is interposed between the gate line 181 and the gate pad 181p to electrically connect the gate pad 181p to the gate line 181. A first end of the gate buffer 181bb adjacent to the gate line 181 is narrower than a second end of the gate buffer 181bb adjacent to the gate pad 181p. For example, a side of the gate pad 181p may not be perpendicular to a side of the gate buffer 181bb, i.e., may have a recessed or concave shape that is recessed toward a central line of the gate buffer 181bb. Alternatively, the side of the gate buffer 181bb may have various shapes, e.g., may be non-linearly tapered between the second end and the first end. When the gate buffer 181bb is wider than the gate line 181, resistance between the gate pad 181p and the gate line 181 is not increased even if the gate buffer 181bb is overetched during manufacturing.

A data buffer 171bb is interposed between the data line 171 and the data pad 171p to electrically connect the data pad 171p to the data line 171. A first end of the data buffer 171bb adjacent to the data line 171 is narrower than a second end of the data buffer 171bb adjacent to the data pad 171p. For example, a side of the data pad 171p may not be perpendicular to a side of the data buffer 171bb, i.e., has a recessed or concave shape that is recessed toward a central line of the data buffer 171bb. Alternatively, the data buffer 171bb may have various shapes, e.g., may be non-linearly tapered between the second end and the first end. When the data buffer 171bb is wider than the data line 171, resistance between the data pad 171p and the data line 171 is not increased even if the data buffer 171bb is overetched during manufacturing.

A driving voltage buffer 172bb is interposed between the driving voltage line 172 and the driving voltage pad 172p to electrically connect the driving voltage pad 172p to the driving voltage line 172. A first end of the driving voltage buffer 172bb adjacent to the driving voltage line 172 is narrower than a second end of the driving voltage buffer 172bb adjacent to the driving voltage pad 172p. For example, a side of the driving voltage pad 172p may not be perpendicular to a side of the driving voltage buffer 172bb, i.e., has a recessed or concave shape with respect to a central line of the driving voltage buffer 172bb. Alternatively, the driving voltage buffer 172bb may have various shapes, e.g., may be non-linearly tapered between the second end and the first end. When the driving voltage buffer 172bb is wider than the driving voltage line 172, resistance between the driving voltage pad 172p and the driving voltage line 172 is not increased even if the driving voltage buffer 172bb is overetched during manufacturing.

Figure 12:
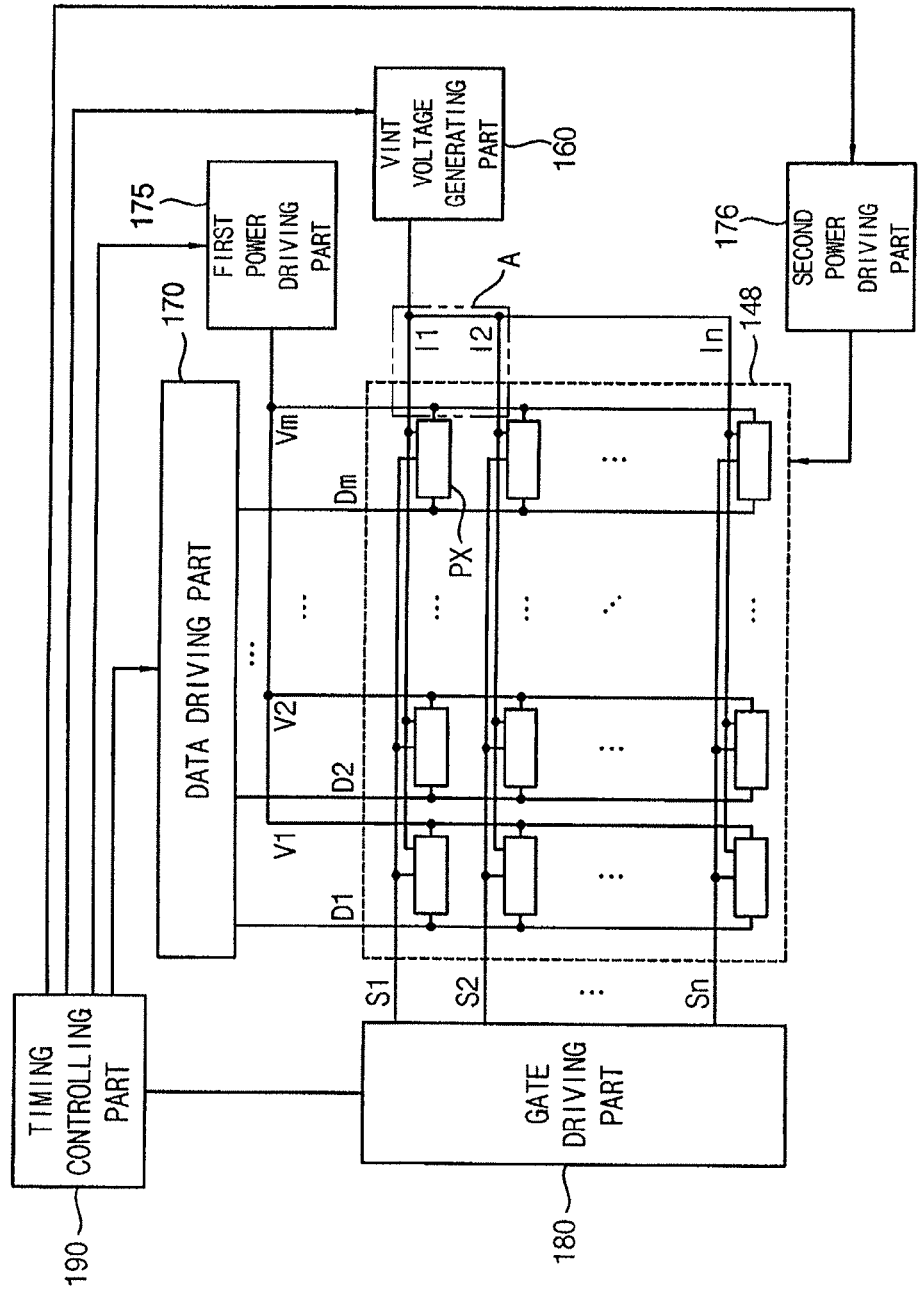
FIG. 12 is a plan view illustrating a display apparatus according to still another example embodiment.

FIG. 12 is a plan view illustrating a display apparatus according to still another example embodiment.

Referring to FIG. 12, the display apparatus includes a plurality of pixels PX', the plurality of gate lines G1, G2, . . . Gn, the plurality of data lines D1, D2, . . . Dm, a plurality of driving voltage lines V1, V2, . . . Vm, the plurality of initial voltage Vint lines (I1, I2, . . . In), an initial voltage Vint generating part 160, the data driving part 170, the first power driving part 175, the second power driving part 176, the scan driving part 180, and the timing controlling part 190.

Each of the pixels PX' displays an image based on a scan signal, a data signal, a driving voltage, an initial voltage Vint, and a second driving voltage from the gate lines G1, G2, . . . Gn, the date lines D1, D2, . . . Dm, the driving voltage lines V1, V2, . . . Vm, the initial voltage Vint lines I1, I2, . . . In and the common or second electrode 148, respectively.

The initial voltage Vint generating part 160 applies the initial voltage Vint to the initial voltage lines I1, I2, . . . In based on an initial voltage control signal from the timing controlling part 190.

Figure 13:
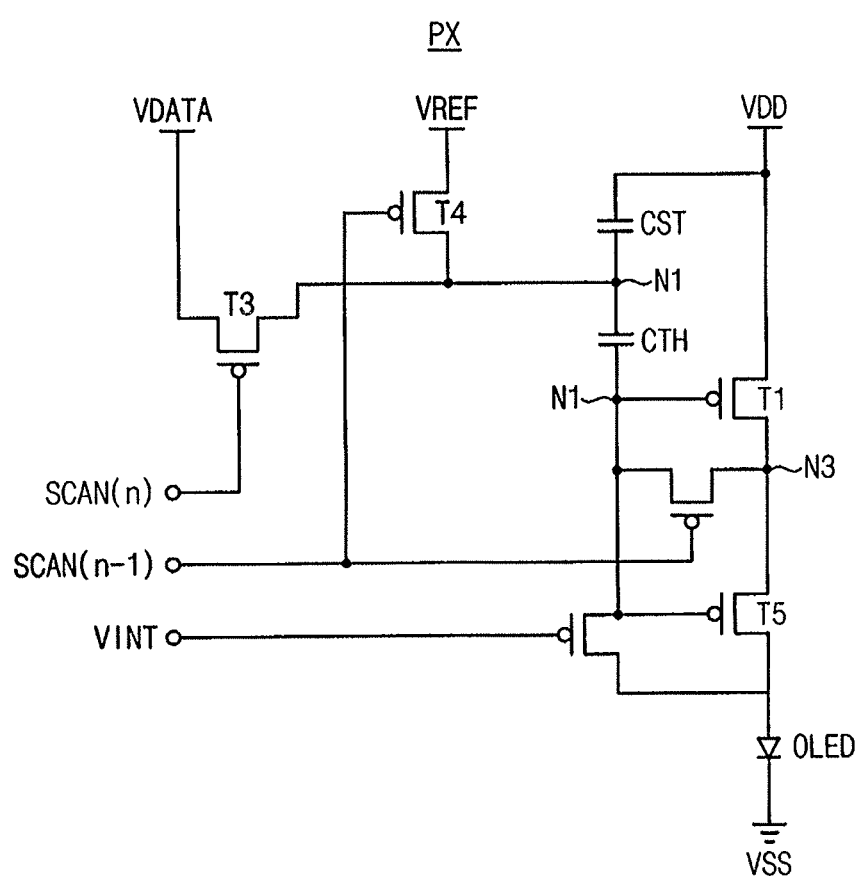
FIG. 13 is a circuit diagram illustrating a pixel of the display apparatus of FIG. 12.

FIG. 13 is a circuit diagram illustrating a pixel of the display apparatus of FIG. 12. Referring to FIGS. 12 and 13, each of the pixels PX' includes a first thin film transistor T1, a second thin film transistor T2, a third thin film transistor T3, a fourth thin film transistor T4, a fifth thin film transistor T5, a sixth thin film transistor T6, a storage capacitor Cst, a threshold voltage capacitor Cth, and an organic light emitting element OLED.

The first thin film transistor T1 of the first to sixth thin film transistor T1 to T6 includes a source electrode receiving the driving voltage Vdd, a drain electrode electrically connected to a source electrode of the fifth thin film transistor T5, and a gate electrode controlled based on electric charge stored in the threshold voltage capacitor Cth.

The fifth thin film transistor T5 includes a drain electrode electrically connected to the organic light emitting element OLED, a source electrode electrically connected to the drain electrode of the first thin film transistor T1, and a gate electrode controlled based on an enable control signal EM. The fifth thin film transistor T5 is turned-on/off based on the enable control signal EM to apply current to the organic light emitting element OLED.

The second thin film transistor T2 of the first to sixth thin film transistor T1 to T6 includes a drain electrode electrically connected to a third node N3, a source electrode electrically connected to a second node, and a gate electrode controlled based on a scan signal scan(n−1) applied to a previous gate line. The third node N3 is disposed between the first thin film transistor T1 and the sixth thin film transistor T6.

The third thin film transistor T3 includes a source electrode receiving a data voltage Vdata, a gate electrode controlled based on a scan signal scan(n) applied to a present gate line, and a drain electrode electrically connected to a first node N1. The first node N1 is disposed between the storage capacitor Cst and the threshold voltage capacitor Cth. The fourth thin film transistor T4 includes a source electrode receiving the driving voltage Vdd, a drain electrode electrically connected to the first node N1, and a gate electrode controlled based on the scan signal scan(n−1) applied to the previous gate line.

The sixth thin film transistor T6 includes a gate electrode receiving the initial voltage Vint, a drain electrode electrically connected to the organic light emitting element OLED, and a source electrode electrically connected to the threshold voltage capacitor Cth. The sixth thin film transistor T6 is controlled based on the initial voltage Vint.

Figure 14:
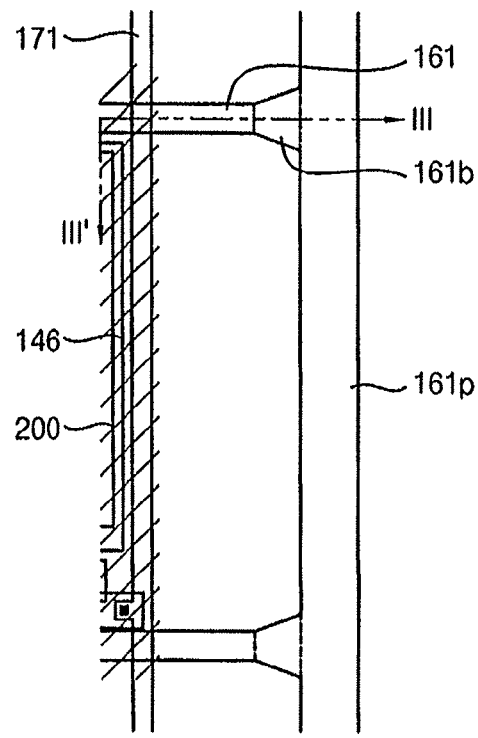
FIG. 14 is an enlarged plan view illustrating a portion of the display apparatus of FIG. 12.
Figure 15:
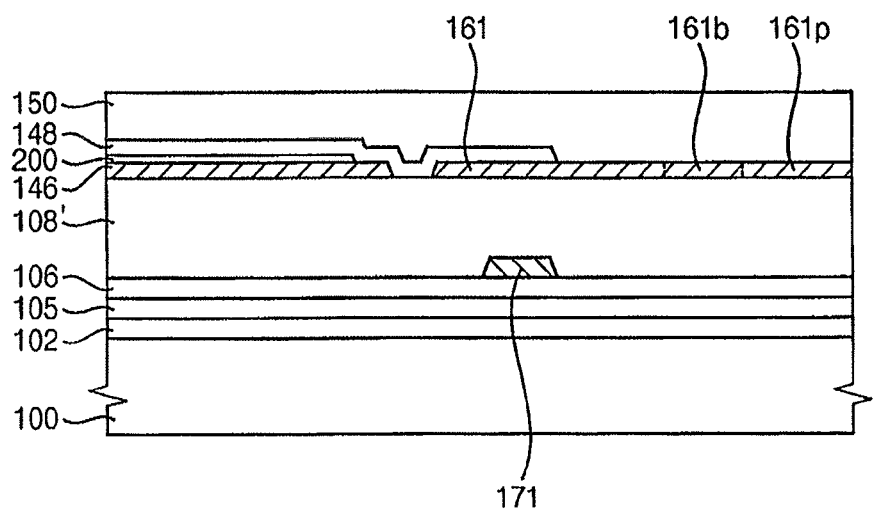
FIG. 15 is a cross-sectional view taken along a line of FIG. 14.

FIG. 14 is an enlarged plan view illustrating a portion of the display apparatus of FIG. 12. FIG. 15 is a cross-sectional view taken along a line of FIG. 14. The organic light emitting display apparatus of FIGS. 14 and 15 is substantially the same as shown in FIGS. 1 to 10C, but includes an initial voltage driving part and an initial voltage Vint. Thus, any repetitive explanations concerning the same elements will be omitted.

Referring to FIGS. 13 and 14, an initial voltage line 161 may be formed from a same layer as a first electrode 146. The initial voltage line 161 is electrically connected to the gate electrode of the sixth thin film transistor T6. When the display apparatus is a front illumination type, the initial voltage line 161, the initial voltage buffer 161b and the initial voltage pad 161p may include metal having high reflectivity, alloy having high reflectivity, etc. Examples of the metal or alloy that may used for the initial voltage line 161, the initial voltage buffer 161b and the initial voltage pad 161p may include aluminum, silver, platinum, gold (Au), chromium, tungsten, molybdenum, titanium, palladium (Pd), iridium (Ir), an alloy thereof, etc. These can be used alone or in a combination thereof. Alternatively, the display apparatus is a rear illumination type, the initial voltage line 161, the initial voltage buffer 161b and the initial voltage pad 161p may include transparent conductive material such as indium tin oxide, tin oxide, indium zinc oxide, zinc oxide, indium gallium oxide, gallium oxide, etc. These can be used alone or in a combination thereof. Alternatively, the initial voltage line 161, the initial voltage buffer 161b and the initial voltage pad 161p may be formed from a same layer as the common or second electrode 148.

The initial voltage pad 161p is disposed adjacent to an end of the initial voltage line 161. The initial voltage pad 161p is electrically connected to the initial voltage line 161 through the initial voltage buffer 161b.

The initial voltage buffer 161b is interposed between the initial voltage line 161 and the initial voltage pad 161p to electrically connect the initial voltage pad 161p to the initial voltage line 161. A first end of the initial voltage buffer 161b adjacent to the initial voltage line 161 is narrower than a second end of the initial voltage buffer 161b adjacent to the initial voltage pad 161p. For example, a side of the initial voltage pad 161p may not be perpendicular to a side of the initial voltage buffer 161b, i.e., may be inclined with respect to the boundary between the initial voltage pad 161p and the initial voltage buffer 161b. When the initial voltage buffer 161b is wider than the initial voltage line 161, resistance between the initial voltage pad 161p and the initial voltage line 161 is not increased even if the initial voltage buffer 161b is overetched during manufacturing.

Figure 16A:
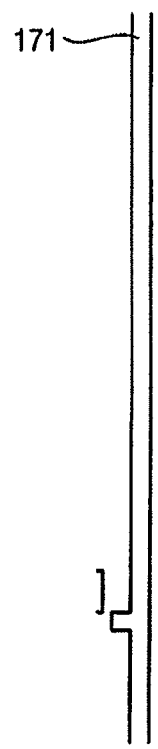
FIGS. 16A, 17A and 18A are plan views illustrating stages in a method of manufacturing the display apparatus of FIG. 14.
Figure 16B:
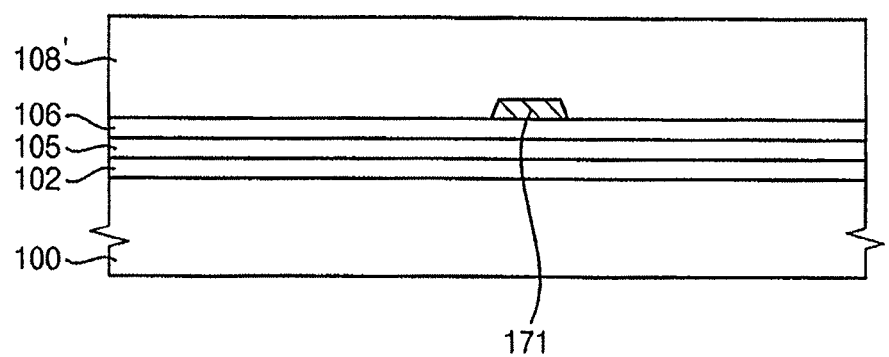
FIGS. 16B, 17B and 18B are cross-sectional views illustrating stages in a method of manufacturing the display apparatus of FIG. 14.
Figure 17A:
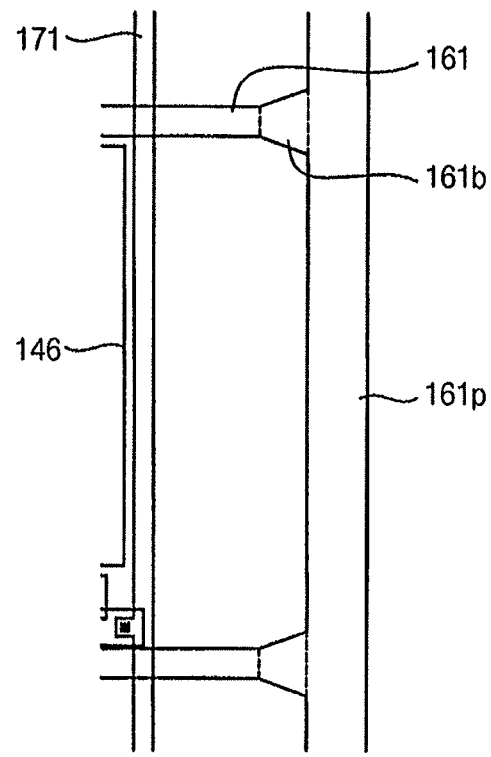
Figure 17B:
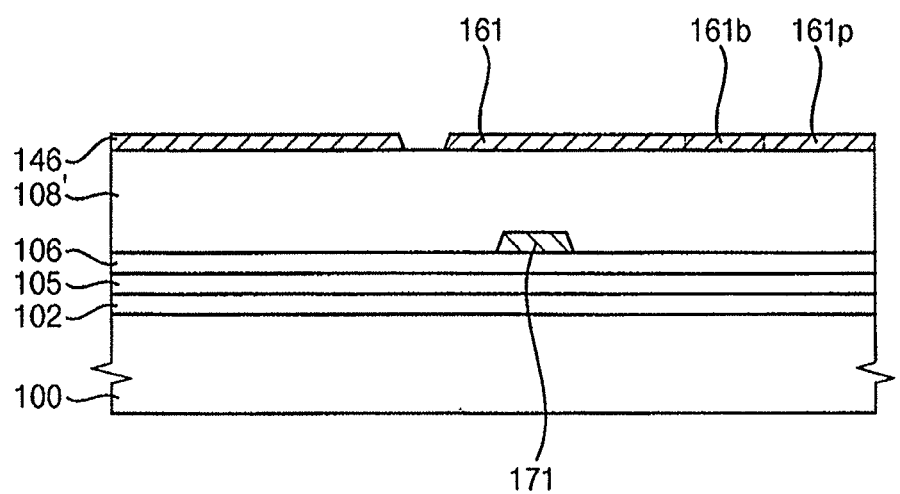
Figure 18A:
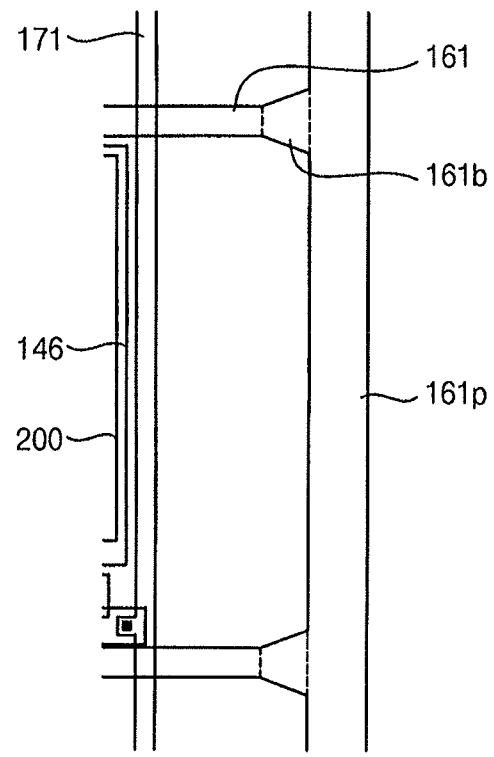
Figure 18B:
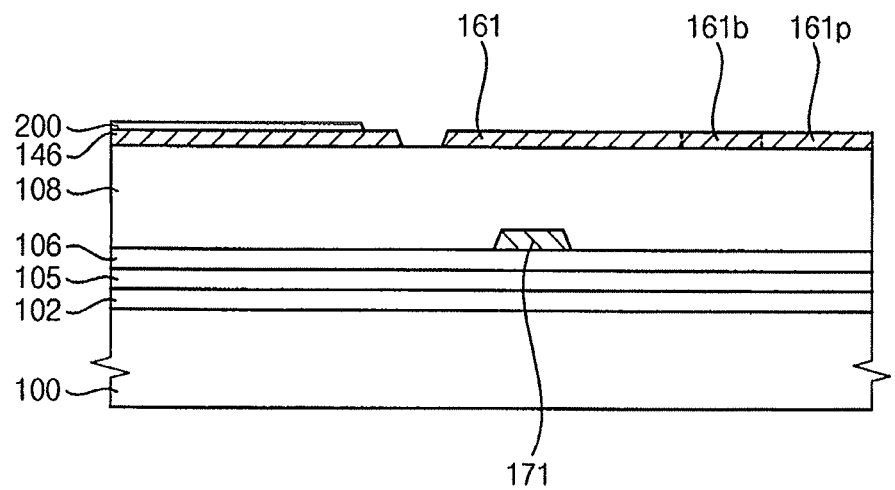

FIGS. 16A, 17A, and 18A are plan views illustrating a method of manufacturing the display apparatus of FIG. 14. FIGS. 16B, 17B, and 18B are cross-sectional views illustrating a method of manufacturing the display apparatus of FIG. 14.

Referring to FIGS. 16A, 16B, and 16C, the buffer layer 102 is formed on the base substrate 100. The active pattern (not shown) is formed on the buffer layer 102. The gate insulating layer 104 is formed on the buffer layer 102 on which the active pattern (not shown) is formed. The gate electrode (not shown) of the first to fifth thin film transistors T1, T2, ... T5, the gate line 181 (shown in FIG. 3), the gate buffer 181b (shown in FIG. 3), and the gate pad 181p (shown in FIG. 3) are formed on the gate insulating layer 104.

The insulating interlayer 106 is formed on the gate insulating layer 104 on which the gate electrodes (not shown), the gate line 181 (shown in FIG. 3), the gate buffer 181b (shown in FIG. 3) and the gate pad 181p (shown in FIG. 3) are formed.

The source and drain electrodes of the first to fifth thin film transistors T1, T2, ... T5, the data line 171, the data buffer 171b (shown in FIG. 3), the data pad 171p (shown in FIG. 3), the driving voltage line 172 (shown in FIG. 3), the driving voltage buffer 172b (shown in FIG. 3), and the driving voltage pad 172p (shown in FIG. 3) are formed on the insulating interlayer 106.

The initial planarizing layer 108' is formed on the insulating interlayer 106 on which the source and drain electrodes (not shown), the data line 171, the data buffer 171b (shown in FIG. 3), the data pad 171p (shown in FIG. 3), the driving voltage line 172 (shown in FIG. 3), the driving voltage buffer 172b (shown in FIG. 3), and the driving voltage pad 172p (shown in FIG. 3) are formed.

Referring to FIGS. 17A and 17B, the initial planarizing layer 108' is partially etched to form the planarizing layer 108 having the contact hole (not shown) through the drain electrode of the fifth thin film transistor T5 is exposed.

The first electrode 146, the initial voltage Vint line 161, the initial voltage Vint buffer 161b and the initial voltage Vint pad 161p are formed on the planarizing layer 108. The first electrode 146 is electrically connected to the drain electrode of the fifth thin film transistor T5 through the contact hole of the planarizing layer 108.

For example, a conductive layer (not shown) is formed on the planarizing layer 108, and thus the conductive layer (not shown) is patterned through a photolithography process or a wet etching using an additional etching mask to form the first electrode 146, the initial voltage Vint line 161, the initial voltage Vint buffer 161b, and the initial voltage Vint pad 161p.

For example, a portion of the mask for patterning the conductive layer (not shown), which corresponds to the initial voltage buffer 161b, is narrower at a boundary between the initial voltage line 161 and the initial voltage buffer 161b than at a boundary between the initial voltage pad 161p and the initial voltage buffer 161b. That is, the side of the initial voltage buffer 161b is not perpendicular to the boundary between the initial voltage pad 161p and the initial voltage buffer 161b. When the initial voltage buffer 161b is wider than the initial voltage line 161, a minimum width between the initial voltage pad 161p and the initial voltage line 161 is maintained, thereby preventing thinning of the initial voltage buffer 161b to be thinner than the initial voltage line 161 or disconnection between the initial voltage pad 161p and the initial voltage line 161.

Referring to FIGS. 18A and 18B, the pixel defining layer 112 (shown in FIG. 3) is formed on the planarizing layer 108 on which the first electrode 146, the initial voltage Vint line 161, the initial voltage Vint buffer 161b, and the initial voltage Vint pad 161p are formed. The organic light emitting element 200 is formed on the first electrode 146 which is exposed by the pixel defining layer 112 (shown in FIG. 3).

Referring to FIGS. 14A and 14B, the second electrode 148 may be formed on the organic light emitting element 200 and the pixel defining layer 112 (shown in FIG. 3). The protecting layer 150 may be formed on the pixel defining layer 112 on which the second electrode 148 and the organic light emitting layer 200 are formed.

According to the present example embodiment, the initial voltage buffer 161b is interposed between the initial voltage line 161 and the initial voltage pad 161p. Also, the initial voltage buffer 161b is wider adjacent to the initial voltage pad 161p than adjacent to the initial voltage line 161. Thus, the initial voltage pad 161p is securely electrically connected to the initial voltage line 161 even if the initial voltage pad 161b is overetched during wet etching.

Figure 19:
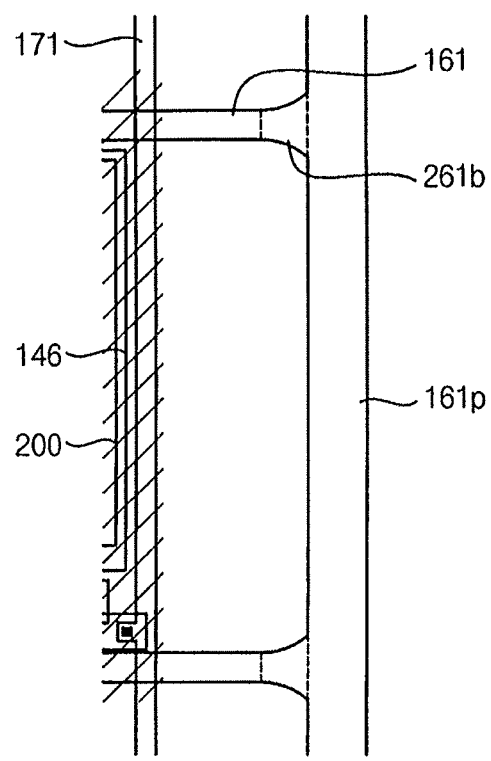
FIG. 19 is a plan view illustrating a display apparatus according to further still another example embodiment.

FIG. 19 is a plan view illustrating a display apparatus according to further still another example embodiment. The display apparatus of FIG. 19 is substantially the same as shown in FIGS. 14 to 18B except the initial voltage Vint buffer. Thus, any repetitive explanations concerning the same elements will be omitted.

Referring to FIG. 19, the initial voltage buffer 261b is interposed between the initial voltage line 161 and the initial voltage pad 161p to electrically connect the initial voltage pad 161p to the initial voltage line 161. A first end of the initial voltage buffer 261b adjacent to the initial voltage line 161 is narrower than a second end of the initial voltage buffer 261b adjacent to the initial voltage pad 161p. For example, a side of the initial voltage pad 161p may not be perpendicular to a side of the initial voltage buffer 261, i.e., has a recessed or concave shape toward a central line the initial voltage buffer 161b. Alternatively, the initial voltage buffer 261b may have various shapes, e.g., may be non-linearly tapered from the second end to the first end. When the initial voltage buffer 261b is wider than the initial voltage line 161, resistance between the initial voltage pad 161p and the initial voltage line 161 is not increased even if the initial voltage buffer 261b is overetched during manufacturing.

The above-mentioned examples are related to an organic light emitting display apparatus. However, embodiments can be applied to various display apparatus such as a liquid crystal display apparatus, an electrophoretic display apparatus, a plasma display panel, etc.

According to the examples, the gate buffer is formed between the gate line and the gate pad. The data buffer is formed between the date line and the data pad. The driving voltage buffer is formed between the driving voltage line and the driving voltage pad. In addition, the initial voltage buffer may be formed between the initial voltage line and the initial voltage pad. One or more of the buffers may be wider at a portion connected to the pads than a width at a portion connected to the lines. Thus, the signal transmission line is securely connected to the pad by an electrical connection, even if the etching liquid is concentrated to the line to overetch the line during the wet etching. Thus, signal transmittance of the lines is increased, so that an image display quality of the display apparatus may be improved.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present embodiments. Accordingly, all such modifications are intended to be included within the scope of the present invention as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a display apparatus, the method comprising:
    forming a conductive layer on a base substrate;
    patterning the conductive layer to form a signal transmission line, a pad, and a buffer, the pad being electrically connected to the signal transmission line, the pad having greater width than the signal transmission line, the buffer being between the signal transmission line and the pad, a first end of the buffer adjacent to the pad being wider than a second end of the buffer adjacent to the signal transmission line; and
    forming a plurality of pixels displaying an image, at least one of the pixels being electrically connected to the signal transmission line.

2. The method as claimed in claim 1, wherein patterning the conductive layer includes a photolithography process including wet etching.

3. The method as claimed in claim 2, wherein a portion of a mask for patterning the conductive layer, which corresponds to the buffer, is narrower at a boundary between the signal transmission line and the buffer than at a boundary between the pad and the buffer.

4. The method as claimed in claim 1, further comprising forming a thin film transistor on the base substrate, the thin film transistor being electrically connected to the signal transmission line and the pixel, wherein the signal transmission line, the pad, and the buffer are formed from a same layer as a gate electrode of the thin film transistor.

5. The method as claimed in claim 1, further comprising forming a thin film transistor on the base substrate, the thin film transistor being electrically connected to the signal transmission line and the pixel, wherein the signal transmission line, the pad, and the buffer are formed from a same layer as source and drain electrodes of the thin film transistor.

6. A method of manufacturing a display apparatus, the method comprising:
    forming a plurality of signal transmission lines and a plurality of thin film transistors on a base substrate;
    forming a conductive layer on the base substrate on which the signal transmission lines and the thin film transistors are formed;
    patterning the conductive layer to form a first electrode, a signal transmission line, a pad ,and a buffer, the pad being electrically connected to the signal transmission line, the pad having greater width than the signal transmission line, the buffer being disposed between the signal transmission line and the pad, a first end of the buffer adjacent to the pad being wider than a second end of the buffer adjacent to the signal transmission line;
    forming an organic light emitting layer on the first electrode; and
    forming a second electrode on the organic light emitting layer.

7. The method as claimed in claim 6, wherein the conductive layer comprises reflective material.

8. The method as claimed in claim 6, wherein the conductive layer comprises transparent conductive material.

9. The method as claimed in claim 6, wherein the signal transmission line, the pad and the buffer serve as an initial voltage line, an initial voltage pad and an initial voltage buffer, respectively.

* * * * *